(12) United States Patent
Jain et al.

(10) Patent No.: US 9,291,907 B2
(45) Date of Patent: *Mar. 22, 2016

(54) METHODS FOR FORMING RESIST FEATURES AND ARRAYS OF ALIGNED, ELONGATE RESIST FEATURES

(75) Inventors: Kaveri Jain, Boise, ID (US); Adam L. Olson, Boise, ID (US); William R. Brown, Boise, ID (US); Lijing Gou, Boise, ID (US); Ho Seop Eom, Boise, ID (US); Anton J. deVilliers, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 656 days.

This patent is subject to a terminal disclaimer.

(21) Appl. No.: 13/475,574

(22) Filed: May 18, 2012

(65) Prior Publication Data

US 2013/0309605 A1  Nov. 21, 2013

(51) Int. Cl.
| | |
|---|---|
| *H01L 21/312* | (2006.01) |
| *G03F 7/38* | (2006.01) |
| *G03F 7/11* | (2006.01) |
| *G03F 7/32* | (2006.01) |

(52) U.S. Cl.
CPC .. *G03F 7/38* (2013.01); *G03F 7/11* (2013.01); *G03F 7/322* (2013.01); *G03F 7/325* (2013.01)

(58) Field of Classification Search
USPC ................................. 430/325, 326
See application file for complete search history.

(56) References Cited

U.S. PATENT DOCUMENTS

| 4,599,136 A * | 7/1986 | Araps et al. ............ 438/424 |
|---|---|---|
| 5,877,076 A | 3/1999 | Dai |
| 6,291,118 B1 | 9/2001 | Gau et al. |
| 6,613,485 B2 | 9/2003 | Huang et al. |
| 6,645,702 B1 | 11/2003 | Rangarajan et al. |
| 6,753,115 B2 | 6/2004 | Zhang et al. |
| 6,955,485 B2 | 10/2005 | Ono et al. |
| 7,033,735 B2 | 4/2006 | Ho et al. |
| 7,138,654 B2 | 11/2006 | Yu et al. |
| 7,429,446 B2 | 9/2008 | Sawada et al. |
| 7,476,612 B2 | 1/2009 | Kim |
| 7,867,844 B2 | 1/2011 | Hu |
| 7,884,014 B2 | 2/2011 | Jang |
| 8,182,982 B2 | 5/2012 | Kobrin |
| 8,815,752 B2 | 8/2014 | Olson et al. |
| 2003/0165756 A1 | 9/2003 | Ono et al. |
| 2004/0058550 A1 | 3/2004 | Mono et al. |
| 2006/0263026 A1 | 11/2006 | Edwards |
| 2007/0105043 A1 | 5/2007 | Elian et al. |
| 2008/0076217 A1 | 3/2008 | Chien et al. |
| 2008/0179190 A1 | 7/2008 | Hu |
| 2009/0084310 A1 | 4/2009 | Choi et al. |
| 2009/0214981 A1 | 8/2009 | Halle et al. |
| 2010/0130016 A1 | 5/2010 | DeVilliers |
| 2010/0190346 A1 | 7/2010 | Makiyama et al. |
| 2011/0084355 A1 | 4/2011 | Lin et al. |
| 2011/0147984 A1 | 6/2011 | Cheng et al. |
| 2011/0291224 A1 | 12/2011 | Fischer et al. |
| 2013/0125988 A1 | 5/2013 | Cao et al. |
| 2013/0189618 A1 | 7/2013 | Yokoya et al. |
| 2013/0309605 A1 | 11/2013 | Jain et al. |
| 2014/0353803 A1 | 12/2014 | Olson et al. |

OTHER PUBLICATIONS

Shang et al., Verification of Numerical Simulation of the Self-Assembly of Polymer-Polymer-Solvent Ternary Blends on A Heterogeneously Functionalized Substrate, Polymer, vol. 52 (2011) pp. 1447-1457.

Berger, Cody M., "Measuring Acid Generation Kinetics in Photoresist Films Via Capacitance Techniques," Georgia Institute of Technology, available at https://smartech.gatech.edu/bitstream/handle/1853/7598/berger_cody_m_200412_phd.pdf, (Aug. 2004), 287 pages.

Prabhu et al., "Polyelectrolyte Effects in Model Photoresist Developer Solutions," J. Vac. Sci. Technol. B, vol. 21, No. 4, (Jul. 2003), pp. 1403-1410.

\* cited by examiner

*Primary Examiner* — Daborah Chacko Davis
(74) *Attorney, Agent, or Firm* — TraskBritt

(57) ABSTRACT

Methods of forming resist features, resist patterns, and arrays of aligned, elongate resist features are disclosed. The methods include addition of a compound, e.g., an acid or a base, to at least a lower surface of a resist to alter acidity of at least a segment of one of an exposed, acidic resist region and an unexposed, basic resist region. The alteration, e.g., increase or decrease, in the acidity shifts an acid-base equilibrium to either encourage or discourage development of the segment. Such "chemical proximity correction" techniques may be used to enhance the acidity of an exposed, acidic resist segment, to enhance the basicity of an unexposed, basic resist segment, or to effectively convert an exposed, acidic resist segment to an unexposed, basic resist segment or vice versa. Thus, unwanted line breaks, line merges, or misalignments may be avoided.

25 Claims, 34 Drawing Sheets

METHODS FOR FORMING RESIST FEATURES AND ARRAYS OF ALIGNED, ELONGATE RESIST FEATURES

FIELD

The present disclosure, in various embodiments, relates generally to semiconductor device design and fabrication. More particularly, this disclosure relates to semiconductor fabrication methods involving techniques for patterning of resist materials for use in lithography processes.

BACKGROUND

Photolithographic patterning is a well-established technology in the manufacturing processes of various integrated circuits (ICs), including ICs with semiconductor devices and liquid crystal display panels.

In photolithography, a mask is used to selectively expose segments of a resist material to an appropriate energy source or chemical composition to define a pattern in the resist material. The resist material may be converted from a non-acidic or basic resist material to an acidic resist material where exposed. That is, exposure of the basic resist material activates a photo-acid generator (PAG) or a thermal acid generator (TAG) within the resist material to generate acid, making the exposed regions acidic. Either the regions of exposed, i.e., acidic resist material, or the regions of unexposed, i.e., basic resist material, may be removed by a developer in which one of the regions is soluble. In a positive tone development process, the developer is formulated and selected such that the exposed, acidic resist regions are soluble in the developer. A resulting resist feature will, therefore, be formed from the unexposed, basic resist regions after the exposed, acidic resist regions are removed in development. In a negative tone development process, the developer is formulated and selected such that the unexposed, basic resist regions are soluble in the developer. A resulting resist feature will, therefore, be formed from the exposed, acidic resist regions after the unexposed, basic resist regions are removed in development.

Chemical interactions between the acidic, exposed resist regions and the basic, unexposed resist regions may shift an acid-base equilibrium boundary during or after selective exposure of the resist. Therefore, an effective "boundary" between the acidic, exposed resist regions and the basic, unexposed resist regions may not correspond to the intended boundaries defined by the mask used during selective exposure. Thus, use of a mask with a precise, intricate pattern, may not necessarily result in the same precise, intricate pattern being transferred to the resist. In addition to the acid-base equilibrium shift, shadowing effects, topographical and masking complexities, and other limitations of conventional masking, exposure, and development acts, may further result in the formed resist pattern not matching the precision or intricacy of the pattern defined in the mask and may otherwise not meet tolerances as to the precise pattern needed.

Areas of the pattern intended to be void of resist material may be undesirably occupied by resist material due to line merge issues. Similarly, areas of the pattern intended to be occupied by resist material may be undesirably unoccupied by resist material due to line breakage or line collapse issues. For example, when patterning to form a resist feature that is ideally uniform in width and height, such as the resist feature 100 illustrated in FIG. 1, limitations of conventional masking, exposure, and development acts may produce an undesirably disjoined or "broken," resist feature, such as separated resist features 200 illustrated in FIG. 2. As another example, when patterning to form separated resist features, e.g., separated resist features 200 of FIG. 2, limitations of conventional masking, exposure, and development acts may produce an undesirably joined resist feature, e.g., resist feature 100 of FIG. 1. Thus, line breaks may be formed or, conversely, line merges may be formed where not wanted. As another example, terminating ends of an array of elongate features formed in the resist material may not actually terminate in alignment with one another; some ends may be longer than desired and some ends may be shorter than desired. Such patterning errors may thereafter be transferred to underlying materials during subsequent pattern transfer.

Efforts have been made to account for shadowing effects and other limitations of photolithography processes. Such efforts include optical proximity correction (OPC) methods and phase shift mask (PSM) methods. With OPC, modifications are made to the pattern in the mask to compensate for the patterning errors and enable the desired pattern to be formed in the resist material. Nonetheless, achieving and transferring a precise, intricate pattern in patterning materials remains a challenge with conventional techniques.

BRIEF DESCRIPTION OF THE DRAWINGS

FIGS. 3 through 8B are isometric schematic illustrations of an uninterrupted resist feature during various stages of processing according to an embodiment of the present disclosure using an uninterrupted mask, a positive tone development, and basic chemical proximity correction to a segment of unexposed patterning resist, wherein FIGS. 5B, 6B, 7B, and 8B are cut-away illustrations of FIGS. 5A, 6A, 7A, and 8A, respectively.

FIGS. 9 through 14B are isometric schematic illustrations of an uninterrupted resist feature during various stages of processing according to an embodiment of the present disclosure using an uninterrupted mask, a negative tone development, and acidic chemical proximity correction to a segment of exposed patterning resist, wherein FIGS. 11B, 12B, 13B, and 14B are cut-away illustrations of FIGS. 11A, 12A, 13A, and 14A, respectively.

FIGS. 15 through 20B are isometric schematic illustrations of an interrupted resist feature during various stages of processing according to an embodiment of the present disclosure using an interrupted mask, a positive tone development, and acidic chemical proximity correction to a segment of exposed patterning resist, wherein FIGS. 17B, 18B, 19B, and 20B are cut-away illustrations of FIGS. 17A, 18A, 19A, and 20A, respectively.

FIGS. 21 through 26B are isometric schematic illustrations of an interrupted resist feature during various stages of processing according to an embodiment of the present disclosure using an interrupted mask, a negative tone development, and basic chemical proximity correction to a segment of unexposed patterning resist, wherein FIGS. 23B, 24B, 25B, and 26B are cut-away illustrations of FIGS. 23A, 24A, 25A, and 26A, respectively.

FIGS. 46 through 50 are isometric schematic illustrations of an interrupted resist feature during various stages of processing according to an embodiment of the present disclosure using an uninterrupted mask, a positive tone development, and acidic chemical proximity correction to a segment of unexposed patterning resist, wherein FIGS. 47 through 50 are cut-away illustrations.

DETAILED DESCRIPTION

Figure 1:
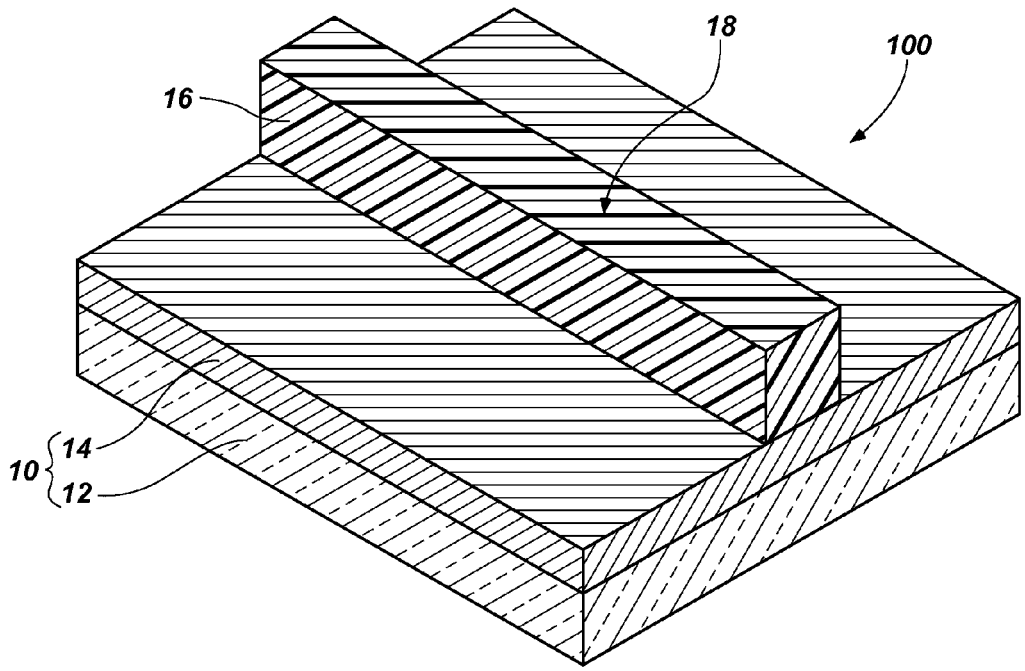
FIG. 1 is an isometric schematic illustration of an uninterrupted resist feature, intended to be formed according to a theoretical patterning process for forming an uninterrupted resist feature or formed according to a conventional patterning process for forming an interrupted resist feature.

Methods of forming resist features, of forming a pattern in a resist, and of forming an array of aligned, elongate resist features are disclosed. The methods include an addition of a compound, e.g., an acid or a base, to at least a lower surface of a patterning resist to alter a level of acidity of at least a segment of one of an exposed, acidic resist region and an unexposed, basic resist region. The alteration, e.g., increase or decrease, in the level of acidity in the resist segment shifts the acid-base equilibrium in the segment so as to either encourage or discourage development of the segment by a developer. Accordingly, where a resist pattern may be otherwise vulnerable to undesired line breakage during development, chemical correction to the patterning resist may be made at the vulnerable region to discourage development of the patterning resist at the vulnerable region. Alternatively, where a resist pattern may be otherwise vulnerable to undesired line merge during development, chemical correction to the patterning resist may be made at the vulnerable region to encourage development of the patterning resist at the vulnerable region. This technique, which may be characterized as "chemical proximity correction," may be used instead of, or in combination with, OPC to compensate for vulnerabilities, errors, or defects in photolithography processes for patterning a resist material.

The chemical correction may include transfer of an acid or base from a marker material over which the patterning resist is formed. The marker material, which may be supported by a base material, may be formulated as an acidic or acid-generating marker material or as a basic or base-generating marker material. Acid from an acidic or acid-generating marker material may therefore diffuse into a segment of the patterning resist to increase the acidity of the segment, enabling the segment to be more likely to be developed by a positive tone developer and less likely to be developed by a negative tone developer. Conversely, base from a basic or base-generating marker material may diffuse into a segment of the patterning resist to decrease the acidity of the segment, enabling the segment to be less likely to be developed by a positive tone developer and more likely to be developed by a negative tone developer. In some embodiments, the marker material may be formulated to include or generate sufficient acid to chemically convert a segment of basic, unexposed patterning resist to a segment of acidic resist such that the segment will be effectively developable or nondevelopable along with the acidic, exposed resist regions. Conversely, in some embodiments, the marker material may be formulated to include or generate sufficient base to chemically convert a segment of acidic, exposed patterning resist to a segment of basic resist such that the segment will be effectively developable or nondevelopable along with the basic, unexposed resist regions.

Thus, the marker material may be used in some embodiments to mark specific areas corresponding to vulnerable regions of the patterning resist, i.e., regions prone to undesirable line break or undesirable line merge. In other embodiments, the marker material may be used to mark a boundary with which features formed in the patterning resist are desired to be aligned. Accordingly, a patterning resist, the acidity of a portion of which has been altered after formation of the patterning resist and without forming another material on or over the patterning resist, may be used to define a more intricate pattern than that definable by conventional techniques. The chemical proximity correction techniques may also be used to pattern a resist with a pattern purposefully differing from a masked pattern. That is, regions of the patterning resist exposed in a masked pattern may be chemically converted to effectively unexposed regions after exposure, and vice versa.

As used herein, the term "substrate" means and includes a base material or construction upon which components, such as those within memory cells as well as other semiconductor device structures, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

As used herein, the term "patterning resist" means and includes a photoresist material formulated such that the material may be applied or otherwise formed and processed to remove only select segments thereof so as to define a pattern therein. The pattern in the patterning resist may, thereafter, be transferred to the base material to form a patterned base material exhibiting the pattern of the patterning resist. For example, and without limitation, the patterning resist may be a conventional 248 nm resist or 193 nm resist, such as a methacrylate-based or cyclic olefin-based photoresist.

As used herein, the term "developable" means a resist material formulated to be selectively dissolved or otherwise removed by an appropriate developer following exposure to an appropriate energy source or to a chemical composition formulated to alter miscibility of the developable material with the developer. Therefore, as used herein, a material referred to as "developable" may be selectively soluble in an appropriate developer. Resists formulated to be developable by a positive tone developer are formulated such that acidic regions of the resist are developable by the positive tone developer. Resist formulated to be developable by a negative tone developer are formulated such that basic regions of the resist are developable by the negative tone developer. Thus, a positive resist is "developable" in that, due to exposure to an appropriate wavelength of radiation or to an appropriate chemical composition, the exposed segments of the positive resist become acidic and may be removed by an appropriate positive tone developer in which only the acidic regions of the positive resist are soluble and in which basic regions of the positive resist are insoluble. A negative resist is "developable" in that, unless exposed to appropriate radiation or an appropriate chemical composition, unexposed regions of the negative resist material are basic, while exposed regions are acidic, and the basic regions are soluble or otherwise removable by a negative tone developer while acidic regions of the negative resist are insoluble.

As used herein, the term "marker material" means and includes a photoresist material or other material formulated to include or generate acid or base and to transfer at least a portion of that acid or base to a material in proximity with the marker material, e.g., an overlying patterning resist material, so as to alter the acidity of the proximate material. The marker material may be a conventional 248 nm resist or 193 nm resist, such as a methacrylate-based or cyclic olefin-based photoresist. The marker material may alternatively or additionally include a bottom anti-reflective coating (BARC) material, a top anti-reflective coating (TARC) material, or other such materials that contain acid or base such that the marker material is formulated to transfer an acid or base to a proximate material. The marker material may alternatively or additionally include one or more of a photo acid generator (PAG) and a thermal acid generator (TAG), such that the marker material is formulated as an acid-generating marker material, which, upon exposure to an appropriate energy source, will generate acid and transfer at least a portion of the acid to a proximate material. Conversely, the marker material may alternatively or additionally include a thermal base generator (TBG), such that the marker material is formulated as a base-generating marker material, which, upon exposure to heat, will generate base and transfer at least a portion of the base to a proximate material.

If, for example, a positive tone development process is to be used, use of an acidic or acid-generating marker material may encourage development and removal of a proximate segment of patterning resist while use of a basic or base-generating marker material may discourage development of the segment. If, as another example, a negative tone development process is to be used, use of an acidic or acid-generating marker material may discourage development of a proximate segment of patterning resist while use of a basic or base-generating marker material may encourage development and removal of the segment.

As used herein, the terms "acidic resist," "acidic patterning resist," "acidic region," "acidic resist region," "acidic marker material," and "acid-generating marker material" mean and include a resist, patterning resist, region, resist region, and marker material, respectively, having, at least at some stage during processing, a pH below about 7.0. The acidic resist, patterning resist, region, resist region, or marker material may be acidic due to initial formation, due to acid loading before or after formation, or due to post-formation processing that affects the acidity of the material, such as exposure to light, heat, or other energy or appropriate compound or mixture of compounds.

As used herein, the terms "basic resist," "basic patterning resist," "basic region," "basic resist region," "basic marker material," and "base-generating marker material" mean and include a resist, patterning resist, region, resist region, and marker material, respectively, having, at least at some stage during processing, a pH above about 7.0. The basic resist, patterning resist, region, resist region, or marker material may be basic due to initial formation, due to base loading before or after formation, or due to post-formation processing that affects the basicity of the material, such as exposure to heat, or other energy or approximate chemical or mixture of chemicals.

As used herein, the terms "positive tone developer" and "positive tone development" mean and include a developer and development process, respectively, in which the developer is formulated such that acidic regions of resist are soluble in the developer.

As used herein, the terms "negative tone developer" and "negative tone development" mean and include a developer and development process, respectively, in which the developer is formulated such that basic regions of resist are soluble in the developer.

As used herein, the term "vulnerable region," means and includes a region of a resist desired to be developed, but prone to nondevelopment by conventional techniques (i.e., without a chemical proximity correction according to the present disclosure), and a region of a resist desired not to be developed, but prone to development by conventional techniques (i.e., without a chemical proximity correction according to the present disclosure).

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, structures, regions, integers, stages, operations, elements, materials, components, and/or groups, but do not preclude the presence or addition of one or more other features, structures, regions, integers, stages, operations, elements, materials, components, and/or groups thereof.

As used herein, the term "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, feature, structure, region, or segment, but are merely idealized representations that are employed to describe embodiments of the present disclosure.

Embodiments are described herein with reference to the accompanying drawing figures. Variations from the shapes of the structures depicted in the figures as a result, for example, of manufacturing techniques and/or tolerances, are to be expected. Thus, embodiments described herein are not to be construed as being limited to the particular shapes or regions as illustrated but include deviations in shapes that result, for example, from manufacturing. For example, a region illustrated or described as box shaped may have rough and/or nonlinear structures. Moreover, sharp angles that are illustrated may be rounded. Thus, the regions illustrated in the figures are schematic in nature and their shapes are not intended to illustrate the precise shape of a region and do not limit the scope of the present claims.

The following description provides specific details, such as material types and processing conditions, in order to provide a thorough description of some embodiments of the disclosed devices and methods. However, a person of ordinary skill in the art will understand that the embodiments of the methods may be practiced without employing these specific details. Indeed, the embodiments of the methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and structures necessary to understand embodiments of the present devices and methods are described herein.

Unless the context indicates otherwise, the materials described herein may be formed by any suitable technique including, but not limited to, spin coating, knife coating, dip coating, blanket coating, chemical vapor deposition ("CVD"), atomic layer deposition ("ALD"), plasma enhanced ALD, and physical vapor deposition ("PVD"). Alternatively, the materials may be grown in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, abrasive planarization, and other methods.

Reference will now be made to the drawings, where like numerals refer to like components throughout. The drawings are not necessarily drawn to scale.

Methods of forming resist features, of forming a pattern in a resist, and of forming an array of elongate resist features are disclosed. The methods include forming a patterning resist above a base material. The patterning resist is selectively exposed to form one or more regions of exposed resist and unexposed resist. A compound, e.g., an acid or a base, is transferred to a lower surface of a segment of the patterning resist to alter a level of acidity of the segment to either encourage or discourage the development of the segment. The compound may be transferred to the segment from a marker material over which the patterning material is formed. Accordingly, the method provides for forming resist features and resist patterns while avoiding undesirable line breaks, undesirable line merges, misalignments, and other such patterning inaccuracies.

The methods disclosed herein may be used to form semiconductor device structures. As nonlimiting examples, the methods may be used to form conductive contacts, conductive interconnects, transistors, and memory devices, including, for example, in dynamic random access memory (DRAM) cells, non-volatile memory cells, and NAND flash memory.

Figure 2:
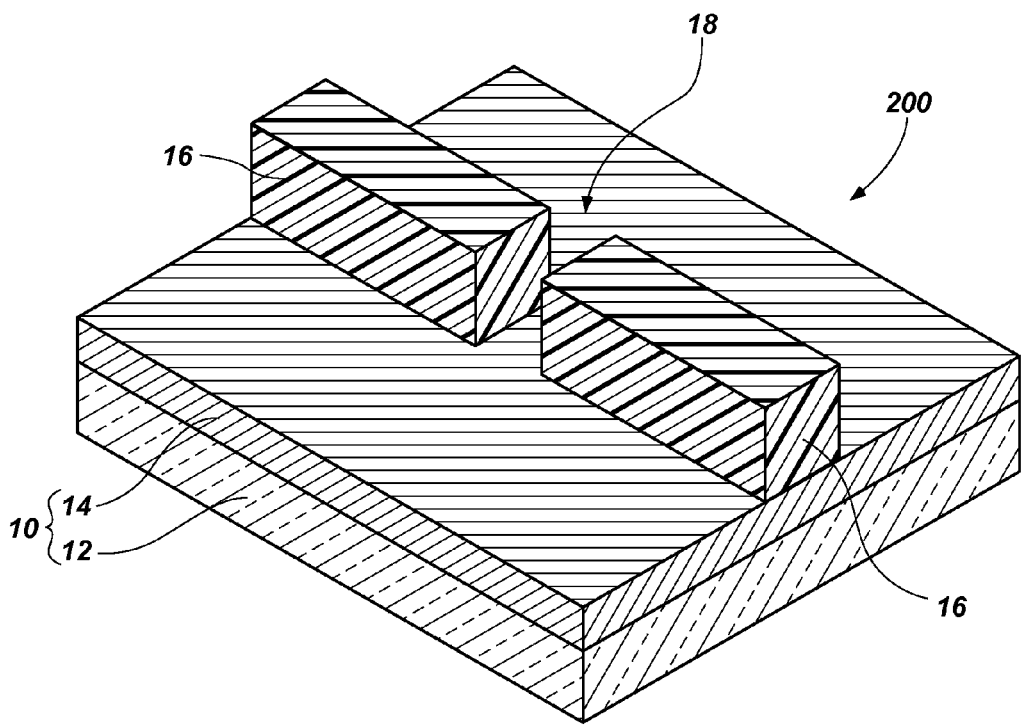
FIG. 2 is an isometric schematic illustration of an interrupted resist feature according to an idealized patterning process for forming an interrupted resist feature or according to a conventional patterning process for forming an uninterrupted resist feature.

FIGS. 1 and 2 illustrate resist features 100, 200, which may be formed over a base material 10. The base material 10 may include a substrate 12 and one or more other materials, such as a hardmask 14, supported by the substrate 12. The substrate 12 may be a semiconductor substrate. The hardmask 14 may be silicon or a metal-containing material, a BARC, a TARC, an acid-rinsed material, a topcoat material, or one or more of these materials.

In certain circumstances, the uninterrupted resist feature 100 illustrated in FIG. 1 may be desired. However, limitations of conventional photolithography processes may produce an interrupted resist feature, e.g., the interrupted resist feature 200 illustrated in FIG. 2. Thus, resist material 16 at region 18 may be vulnerable to development and may be developed and removed though the resist material 16 at region 18 is intended and desired to remain after formation of the uninterrupted resist feature 100. The resist material 16 at region 18 may be vulnerable because of acid-base equilibrium shifts between exposed and non-exposed regions of the resist, because of shadowing effects, because of topographical and masking complexities, or other limitations of conventional masking, exposure, and development acts. Thus, undesirable "line breakage" may form the interrupted resist feature 200, instead of the uninterrupted resist feature 100.

In other circumstances, an interrupted resist feature, such as the interrupted resist feature 200, may be desired. However, limitations of conventional photolithography processes may produce an undesirably "line merged" resist feature, such as the uninterrupted resist feature 100. In such circumstances, region 18 presents a segment of resist material 16 desired to be developed, but which is undesirably undeveloped and not removed during development.

Chemical proximity correction techniques, according to some embodiments of the present disclosure, may be used to form an uninterrupted resist feature without line breakage, as illustrated in FIGS. 3 through 14B, or to form an interrupted resist feature without line merge, as illustrated in FIGS. 15 through 26B, by appropriately encouraging or discouraging development of segments of patterning resist in accordance with masks used for selective exposure of the patterning resist. Thus, segments left unexposed to prevent development by a positive tone developer are altered chemically with base to discourage development, segments exposed to prevent development by a negative tone developer are altered chemically with acid to discourage development, segments exposed to accommodate development by a positive tone developer are altered chemically with acid to encourage development, and segments unexposed to accommodate development by a negative tone developer are altered chemically with base to encourage development.

Figure 3:
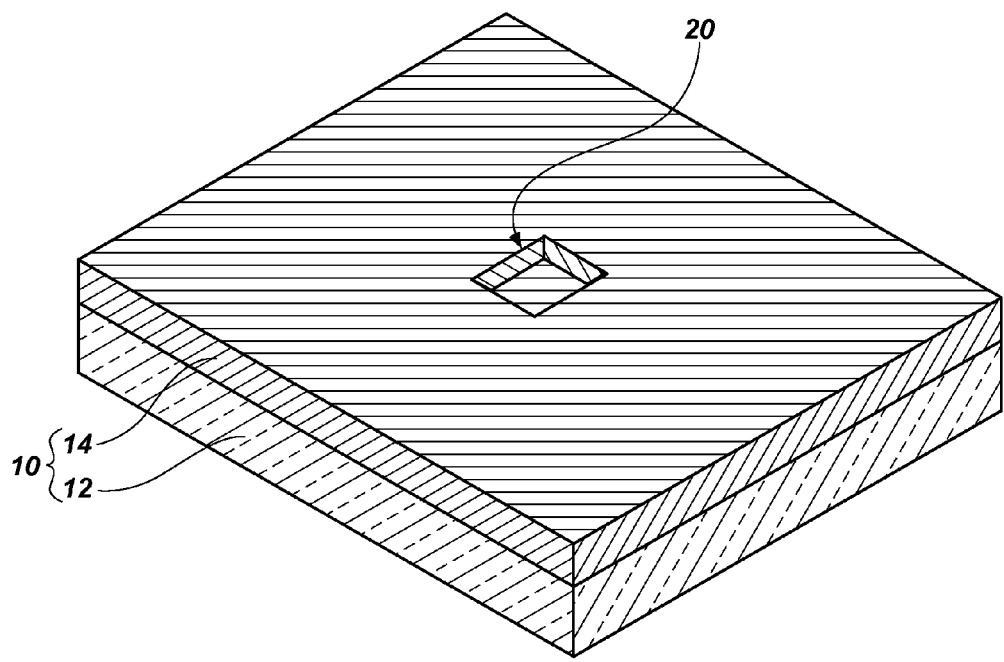

FIGS. 3 through 8B illustrate a method of forming an uninterrupted resist feature using positive tone development and basic chemical proximity correction on a segment of unexposed patterning resist. With reference to FIG. 3, a base material 10, which may include a substrate 12 and one or more other materials, such as a hardmask 14, is provided. A recess 20 may be formed in the base material 10, e.g., in the hardmask 14. The recess 20 may be formed at an area corresponding to a region where the resist feature to be formed is known to be vulnerable to line breakage, e.g., at region 18 of FIGS. 1 and 2.

The recess 20 may be a shallow recess, i.e., a recess that extends partially into the thickness of the hardmask 14. The recess 20 may define a low aspect ratio (i.e., a ratio of the height of the recess 20 to the width of the recess 20 that is less than 1:1, e.g., 1:2 or 1:4). The recess 20 may be formed by conventional methods, which are not described in detail herein.

Figure 4:
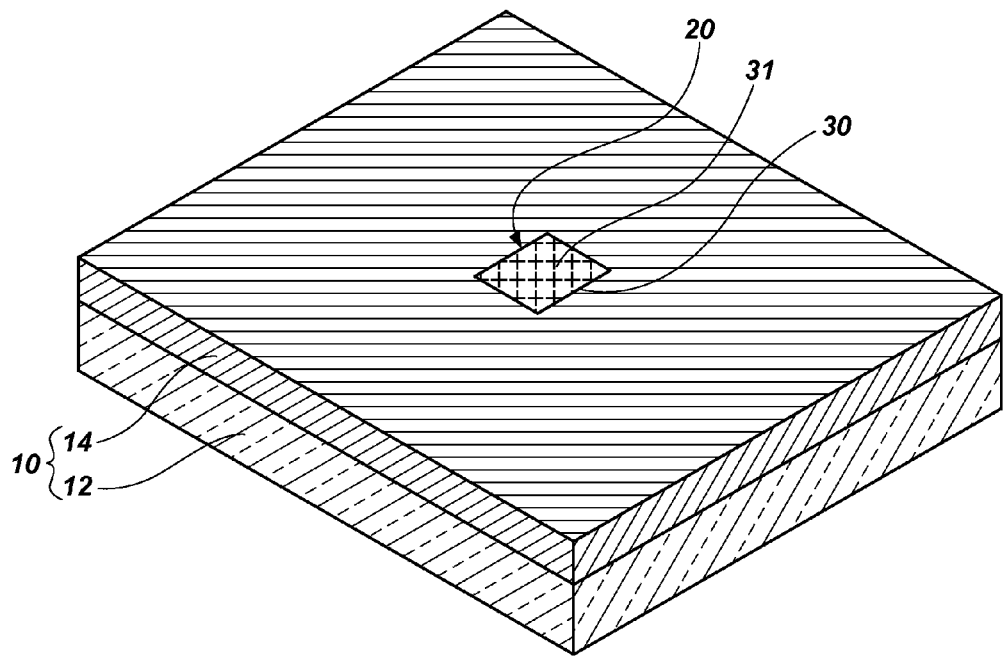

As illustrated in FIG. 4, a marker material 30 may be formed in the recess 20 by conventional methods. The marker material 30 may be formed in the recess 20 at a thickness of from approximately 5 nm to approximately 20 nm. After exposing the marker material 30 to heat (i.e., a soft bake), the marker material 30 and the hardmask 14 may be planarized by an appropriate conventional method, e.g. chemical-mechanical planarization (CMP), so that a primary, exposed surface of the marker material 30 is co-planar with a primary surface of the hardmask 14. In other embodiments (not shown), the marker material 30 may extend above the primary surface of the hardmask 14.

The marker material 30 may be a basic marker material 31. For example, and without limitation, the basic marker material 31 may be a resist material including a thermal base generator (TBG), e.g., between about 0.01 weight percent and about 10 weight percent TBG. Upon heating the TBG-including basic marker material 31, base may be generated in the marker material 31. Such TBG-containing basic marker material 31 may be formed over the hardmask 14, e.g., in the recess 20 formed in the hardmask 14, then heated to generate base within the basic marker material 31. Alternatively, the basic marker material 31 may become basic by adding base to the marker material 30 during or after formation in the recess 20.

Figure 5A:
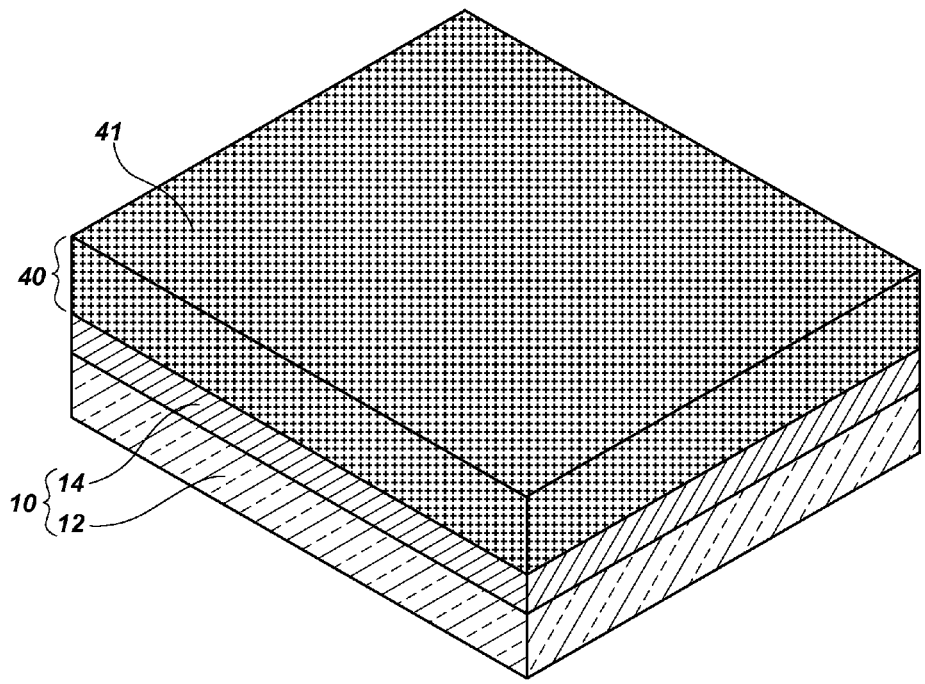
Figure 5B:
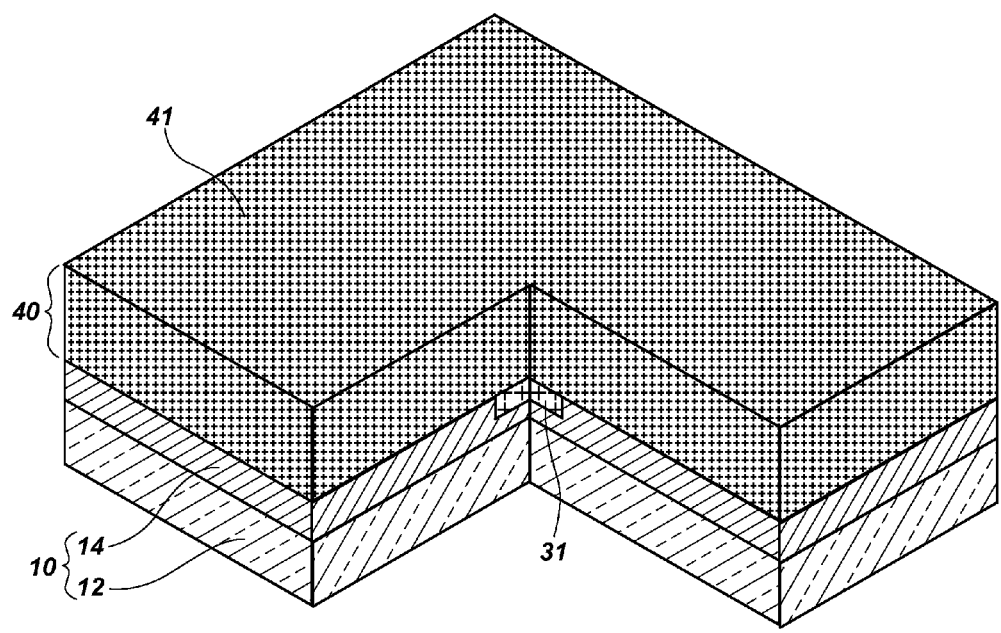

With reference to FIGS. 5A and 5B, a patterning resist 40 is formed over the base material 10 and the basic marker material 31. The patterning resist 40 may be formed after the marker material 30 is made basic or before the marker material 30 is made basic. For example, a TBG-including marker material 30 may be heated after the patterning resist 40 is formed to activate the TBG and generate base, resulting in the patterning resist 40 overlying the basic marker material 31.

The patterning resist 40, upon initial formation may be a basic patterning resist 41, which is otherwise referred to herein as a "non-acidic" resist. Forming the patterning resist 40 over the marker material 30 may be accomplished using an appropriate conventional formation method, such as spin coating of the patterning resist 40 material. In some embodiments, both the marker material 30 and the patterning resist 40 are resist materials. Therefore, each of the marker material 30 and the patterning resist 40 may be formed using a solution of the marker material 30 and a solution of the patterning resist 40, respectively. The solvent used to form the marker material 30 solution and the patterning resist 40 solution may be selected dependent on the miscibility and immiscibility of the other resist material. For example, the solvent may be an alcohol, cyclohexanone, propylene glycol methyl ether acetate (PGMEA), propylene glycol monomethyl ether (PGME), or combinations thereof. Since the patterning resist 40 may be formed over the marker material 30, the solvent in which the patterning resist 40 is dissolved during application of the patterning resist 40 may be formulated to be immiscible with the marker material 30. Accordingly, forming the patterning resist 40 may not affect the as-formed marker material 30.

For example, without limitation, the marker material 30 may be dissolved in an organic solvent, and the solution of the marker material 30 in the organic solvent may be formed in or over the hardmask 14. Once formed, the marker material 30 may be exposed to radiation or heat to convert the marker material 30 to a material immiscible in the organic solvent. Thereafter, the patterning resist 40, which may include the same resist material used as the marker material 30, may be formed over the marker material 30 using the same organic solvent. The exposed marker material 30, now being immiscible in the organic solvent, may not be affected by the formation of the patterning resist 40 using the solution of the patterning resist 40 in the organic solvent.

Figure 6A:
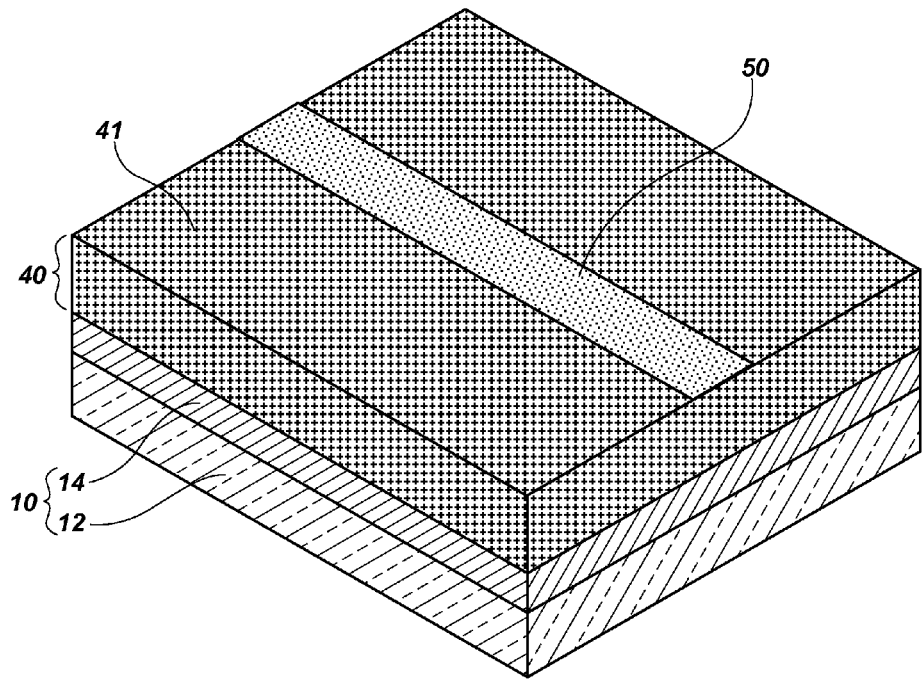
Figure 6B:
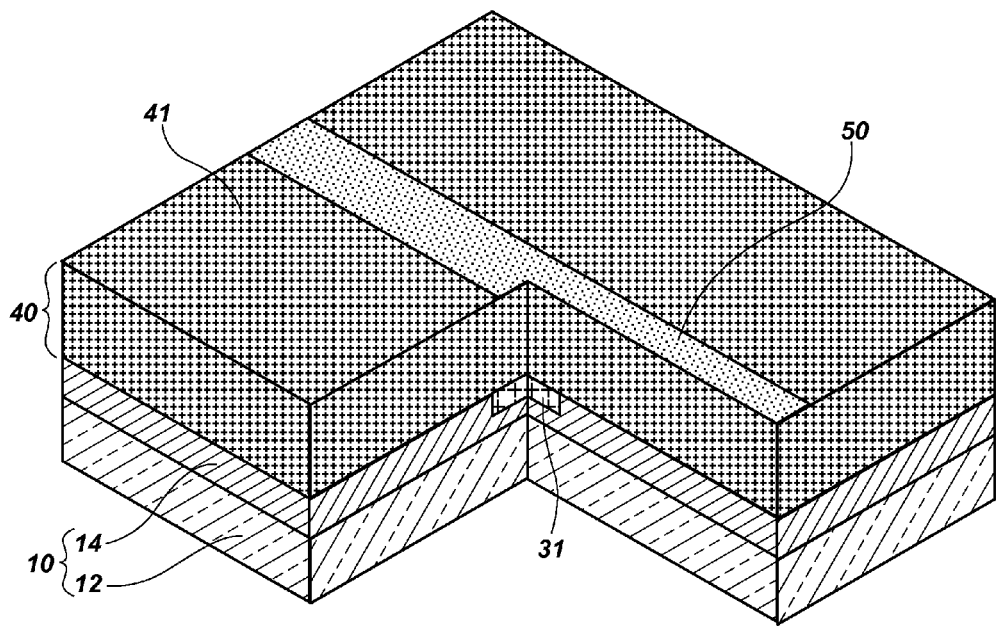

With reference to FIGS. 6A and 6B, the patterning resist 40 may be selectively exposed to an appropriate energy source, e.g., light or radiation, or to a chemical composition to alter the miscibility of the exposed regions of the patterning resist 40 in a developer to be used relative to the miscibility of the unexposed regions of the patterning resist 40. A mask 50 may be used to selectively conceal from exposure the regions to remain unexposed. The mask 50 may conceal an uninterrupted region of the basic patterning resist 41, as illustrated in FIG. 6A.

Figure 7A:
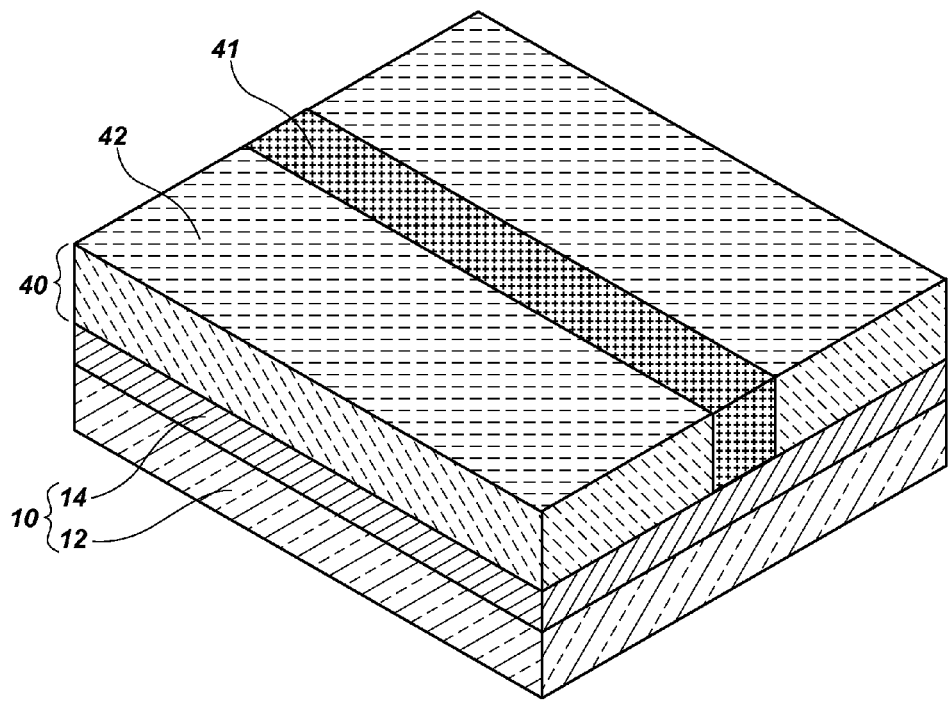
Figure 7B:
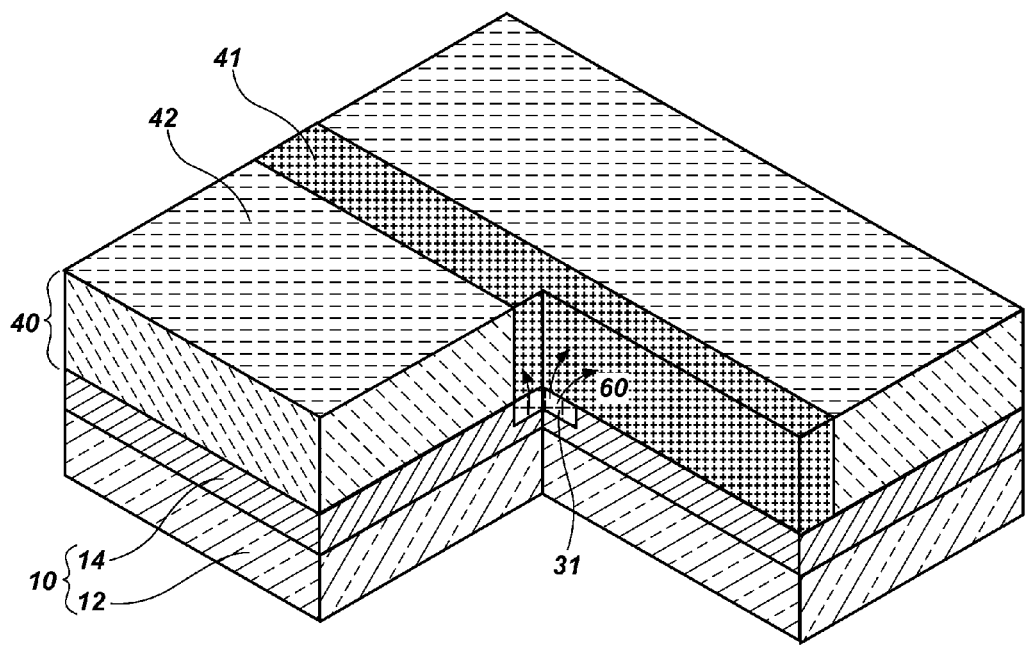

With reference to FIGS. 7A and 7B, the selective exposure of the patterning resist 40 defines at least one region of exposed resist and at least one region of unexposed resist. Because exposure converts the patterning resist 40 from the original, basic patterning resist 41 to an acidic patterning resist 42, the selective exposure defines at least one region of acidic patterning resist 42 and at least one region of basic patterning resist 41. The region of basic patterning resist 41 may at least partially conform to a pattern defined by the mask 50 used.

As illustrated in FIG. 7B, base from the basic marker material 31 may diffuse into a lower area of a segment of the patterning resist 40 proximate to the basic marker material 31. The base may diffuse in the direction illustrated by arrows 60. Therefore, the basic marker material 31 increases the basicity, and therefore decreases the acidity, of the segment of the patterning resist 40 proximate, e.g., overlying, the basic marker material 31. The base transferred to the segment of the patterning resist 40 from the basic marker material 31 may therefore alter the acidity of a segment of the patterning resist 40, altering the miscibility of the segment of the patterning resist 40 in a developer to be used during development.

Figure 8A:
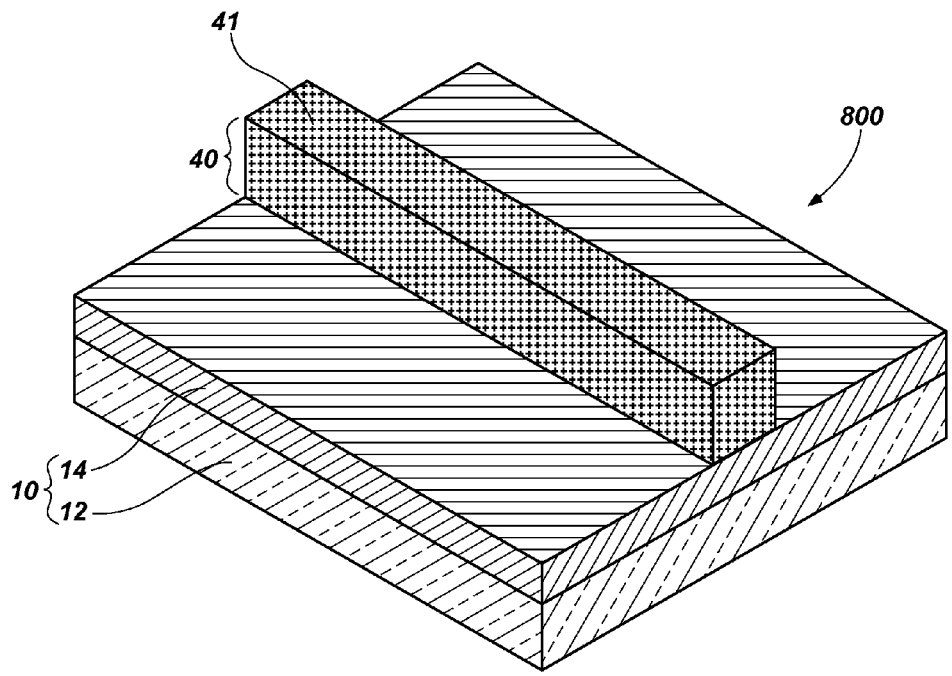
Figure 8B:
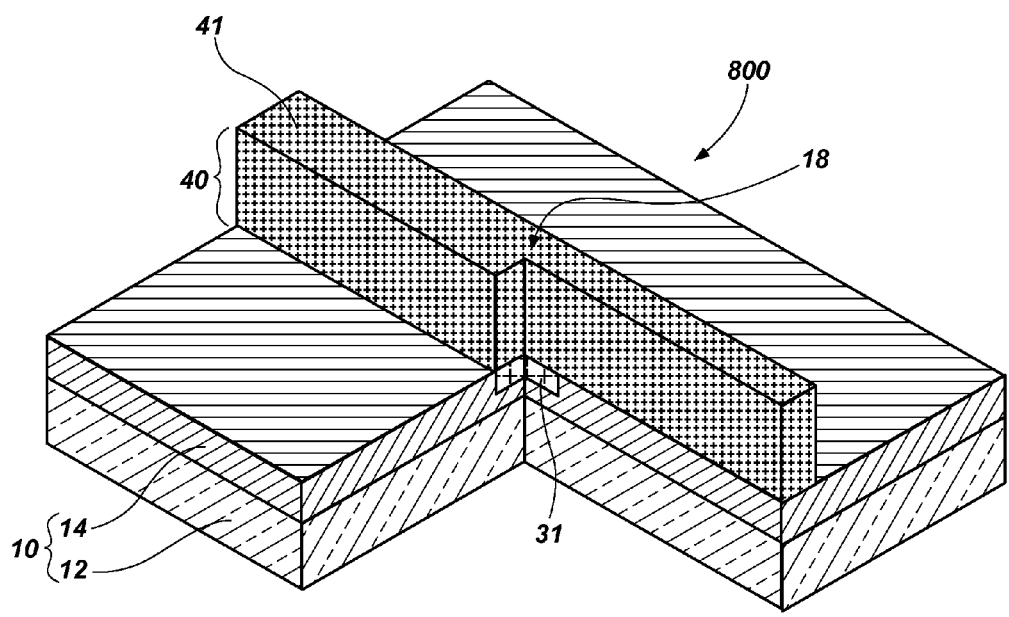

During development, therefore, as illustrated in FIGS. 8A and 8B, a positive tone developer, selective for the regions of exposed, acidic patterning resist 42 and in which the acidic patterning resist 42 is miscible, is used to develop and remove the acidic patterning resist 42, leaving the basic patterning resist 41, including the segment of patterning resist 40 proximate to the basic marker material 31. Accordingly, an uninterrupted resist feature 800 is formed.

Because the basic marker material 31 transferred base to a proximate segment of the patterning resist 40 to discourage development, the patterning resist 40 directly overlying and disposed nearby the basic marker material 31 may not be removed during development, preventing unwanted line breakage. The dimensions of the segment of the patterning resist 40 affected by the base transferred from the basic marker material 31 may depend on the basicity of the basic marker material 31 and other conditions of the materials during processing. It is contemplated that the amount of base in the basic marker material 31 and the conditions for processing may be tailored to achieve an affected segment of desired dimensions. For example, the basic marker material 31 may be formulated to have a higher amount of base if a relatively-large segment of patterning resist 40 is to be affected compared to a basic marker material 31 formulated to affect a relatively-small segment of patterning resist 40.

Figure 9:
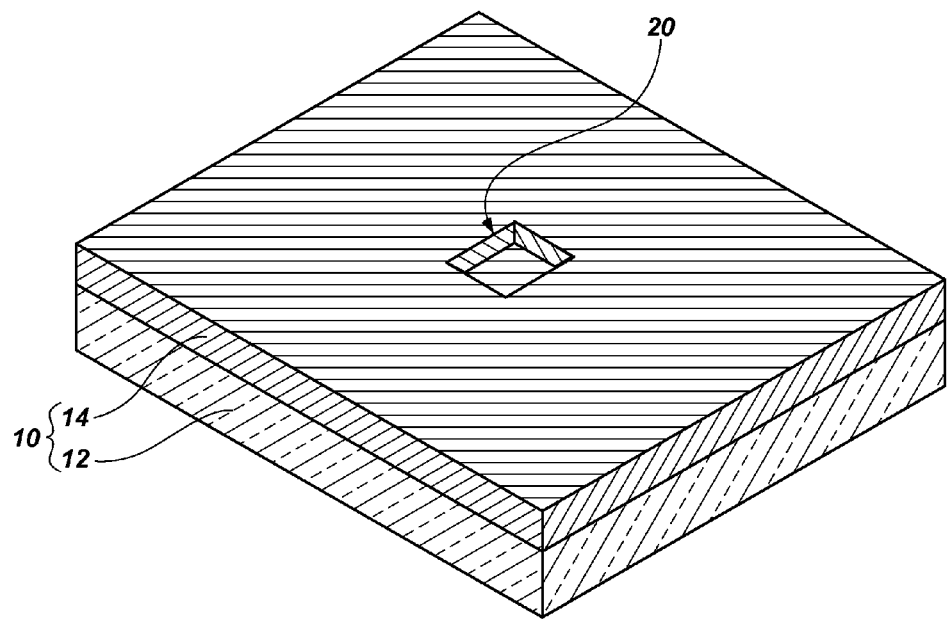
Figure 10:
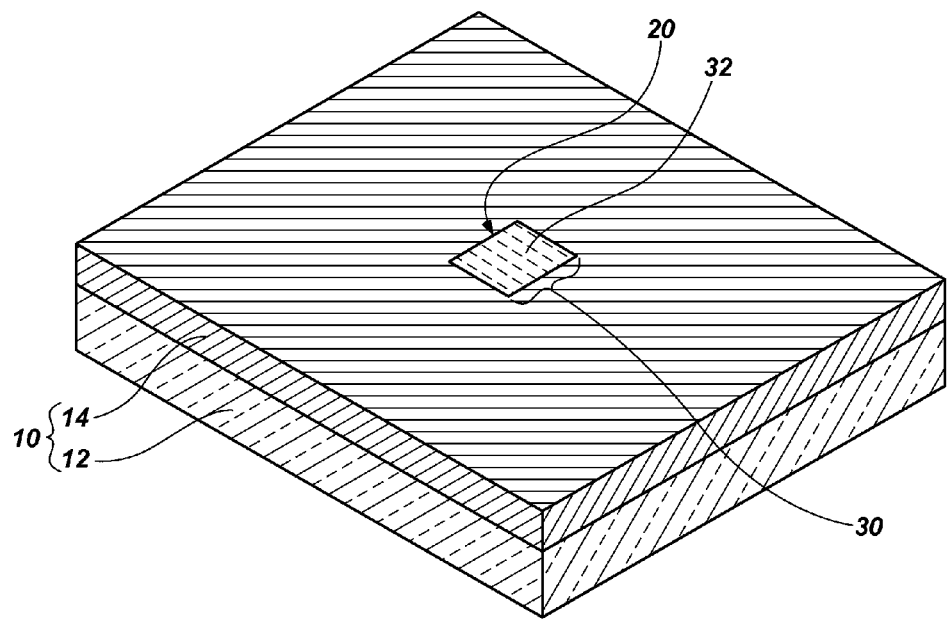

FIGS. 9 through 14B illustrate a method of forming an uninterrupted resist feature using negative tone development and acidic chemical proximity correction on a segment of exposed patterning resist. With reference to FIGS. 9 and 10, the recess 20 may be formed in the base material 10, and the marker material 30 formed in the recess 20 by conventional methods. The marker material 30 may be an acidic marker material 32. The acidic marker material 32 may be a resist material including an acid-generating material, such as a thermal-acid-generator (TAG), a photo-acid-generator (PAG), or both. More specifically, the acidic marker material 32 may be a resist material including between about 0.01 weight percent and about 10 weight percent PAG. Upon heating or photo-exposing the TAG-containing acidic marker material 32 or the PAG-containing acidic marker material 32, respectively, acid may be generated in the acidic marker material 32. Such TAG-containing or PAG-containing acidic marker material 32 may be formed over the hardmask 14, e.g., in the recess 20 formed in the hardmask 14, then heated or photo exposed to generate acid within the acidic marker material 32 before the patterning resist 40 is formed over the acidic marker material 32. In other embodiments, the acidic marker material 32 may be acid loaded before or after forming the marker material 30 so as to form the acidic marker material 32. The acidic patterning resist 42 may be acidic due to its initial formulation, due to acid loading after formation, or due to post-formation processing, e.g., exposure to light or other radiation.

Figure 11A:
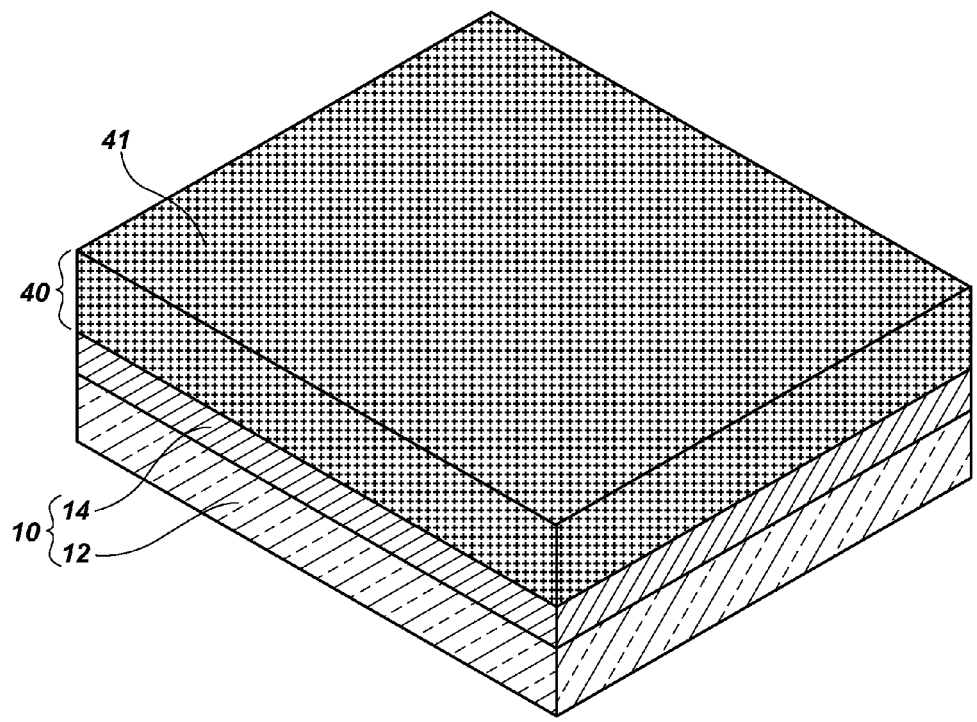
Figure 11B:
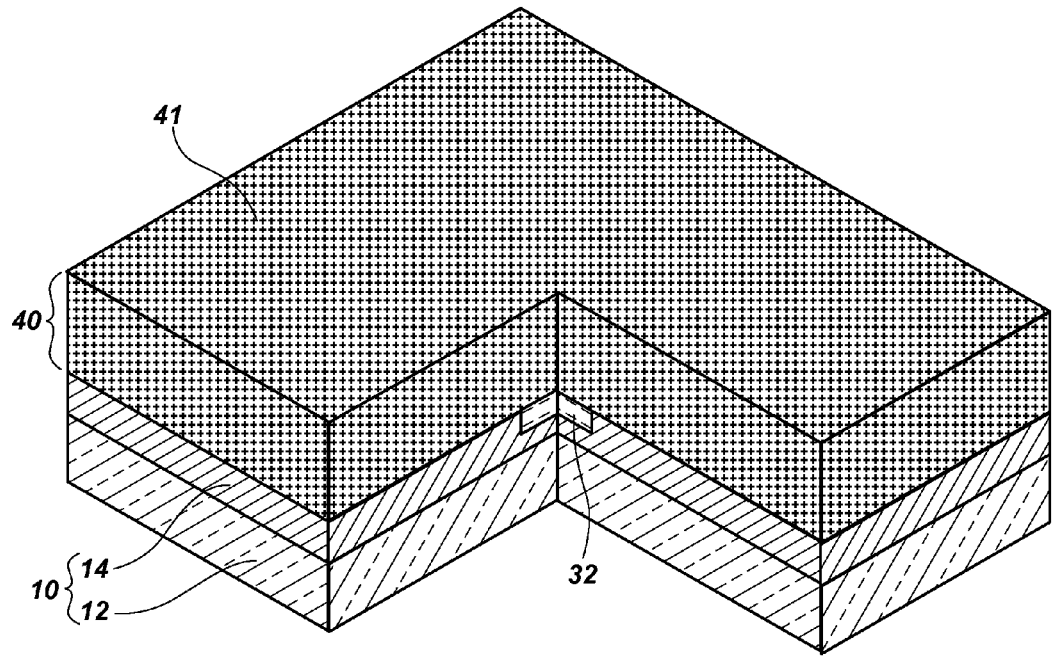

With reference to FIGS. 11A and 11B, the patterning resist 40 may be formed over the base material 10 and the acidic marker material 32. The patterning resist 40 may be formed after the marker material 30 becomes acidic or before the marker material becomes acidic. For example, a TAG-containing or PAG-containing marker material 30 may be heated or exposed to light after the patterning resist 40 is formed to activate the TAG or PAG and generate acid, resulting in the patterning resist 40 overlying the acidic marker material 32.

Figure 12A:
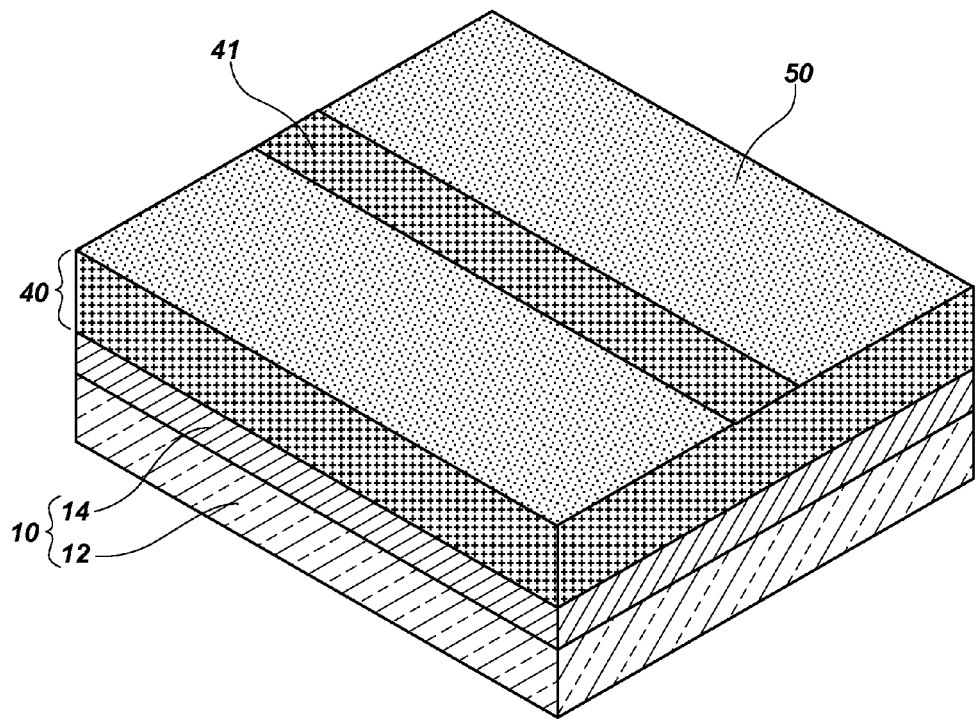
Figure 12B:
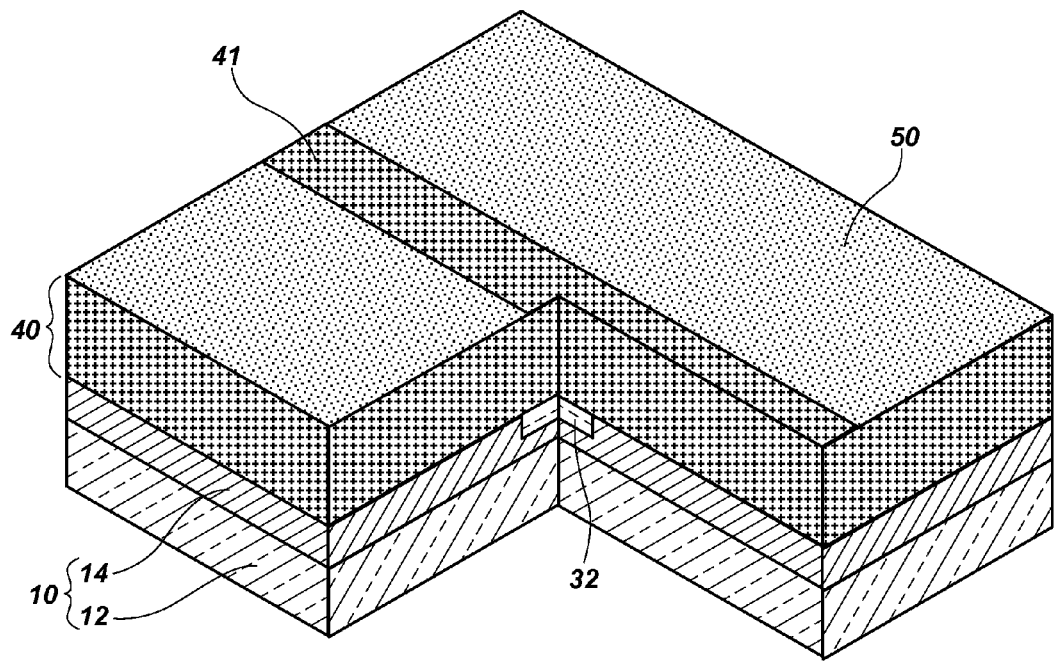
Figure 13A:
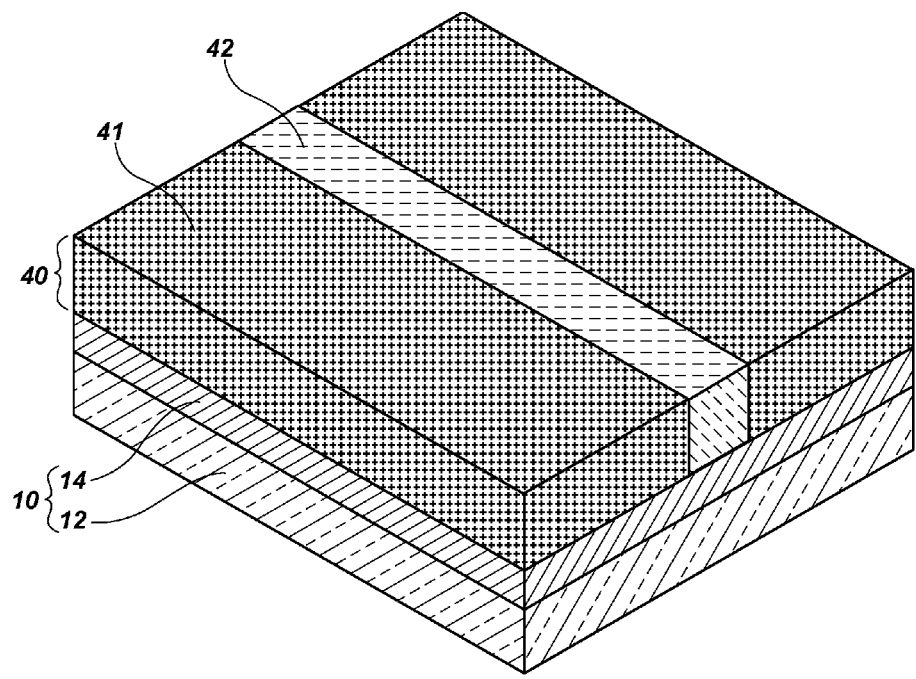
Figure 13B:
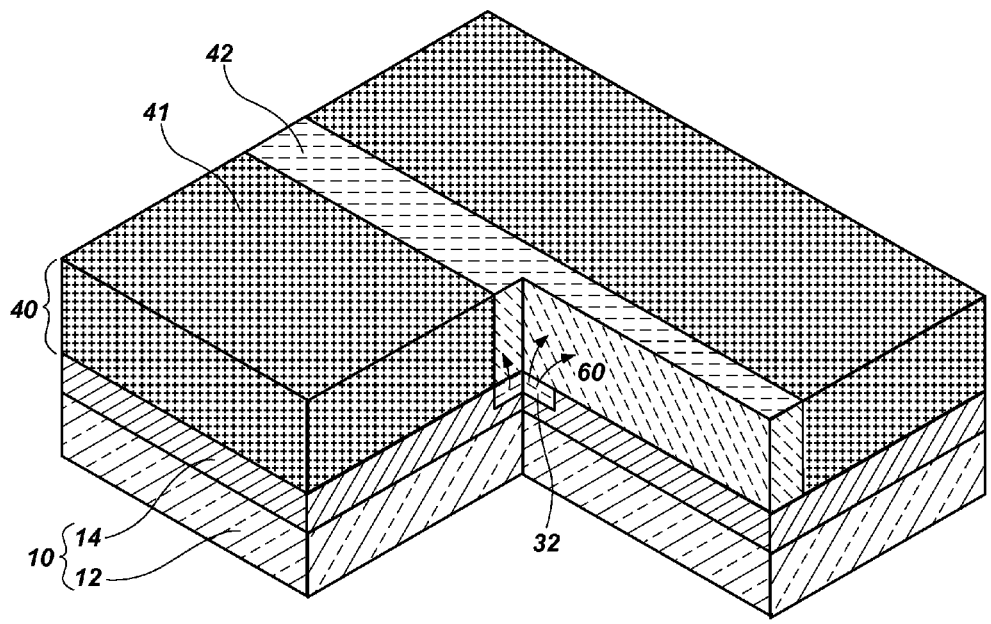

With reference to FIGS. 12A and 12B, the patterning resist 40, which may initially be a basic patterning resist 41, may be selectively exposed using a mask 50 defining an uninterruptible feature pattern overlying the acidic marker material 32. With reference to FIGS. 13A and 13B, the selective exposure defines regions of unexposed, basic patterning resist 41 and at least one region of exposed, acidic patterning resist 42. Acid from the acidic marker material 32 may diffuse in the direction of arrows 60 to increase the acidity of the patterning resist 40 in a segment proximate to the acidic marker material 32, altering the miscibility of the segment of the patterning resist 40 in a developer to be used during development.

Figure 14A:
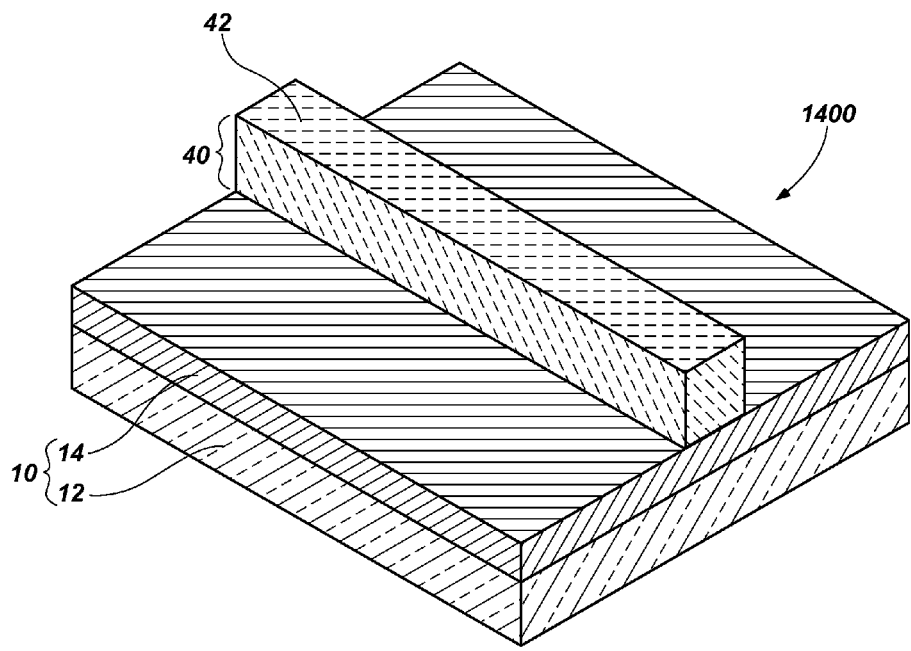
Figure 14B:
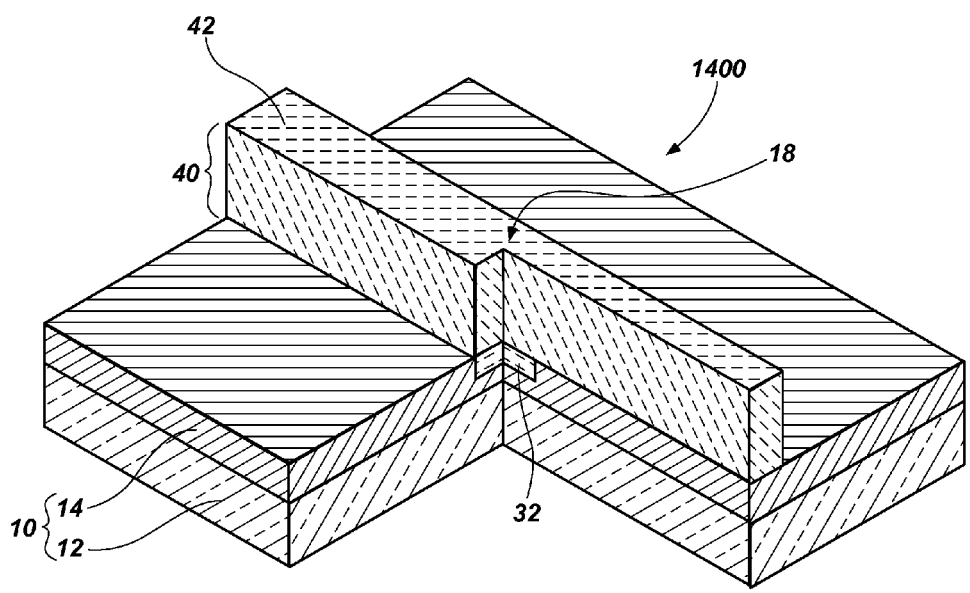

The patterning resist may be subsequently developed, as illustrated in FIGS. 14A and 14B, using a negative tone developer, selective for the regions of unexposed, basic patterning resist 41 and in which the segment of acid-enhanced patterning material proximate to the acidic marker material 32 is immiscible. Accordingly, an uninterrupted resist feature 1400 is formed.

Because the acidic marker material 32 transferred acid to a proximate segment of the patterning resist 40 to prevent development, the patterning resist 40 directly overlying the acidic marker material 32 and portions of the patterning resist 40 nearby may not be removed during development, discouraging unwanted line breakage. The dimensions of the segment of the patterning resist 40 affected by the acid transferred from the acidic marker material 32 may depend on the acidity of the acidic marker material 32 and other conditions of the materials during processing. It is contemplated that the amount of acid in the acidic marker material 32 and the conditions for processing may be tailored to achieve an affected segment of desired dimensions. For example, the acid marker material 32 may be formulated to have a higher level of acid if a relatively-large segment of patterning resist 40 is to be affected compared to an acidic marker material 32 formulated to affect a relatively-small segment of patterning resist 40.

Figure 15:
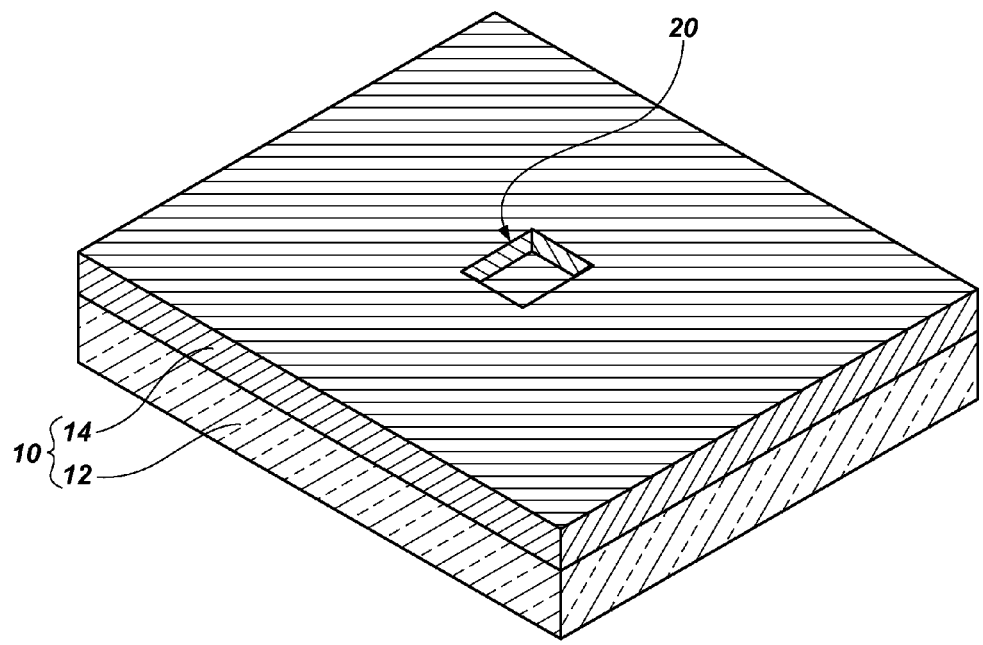
Figure 16:
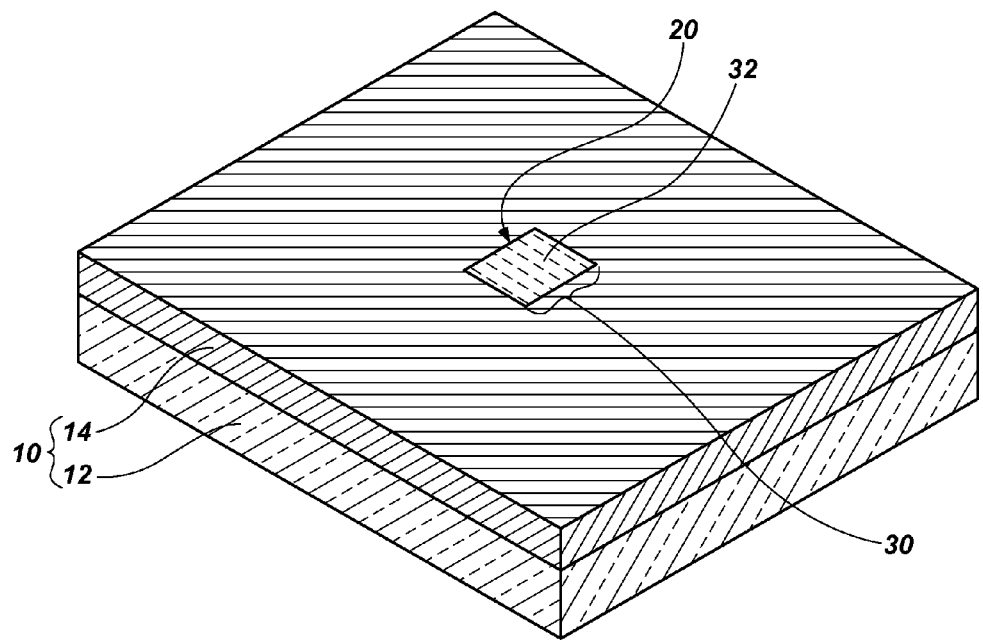
Figure 17A:
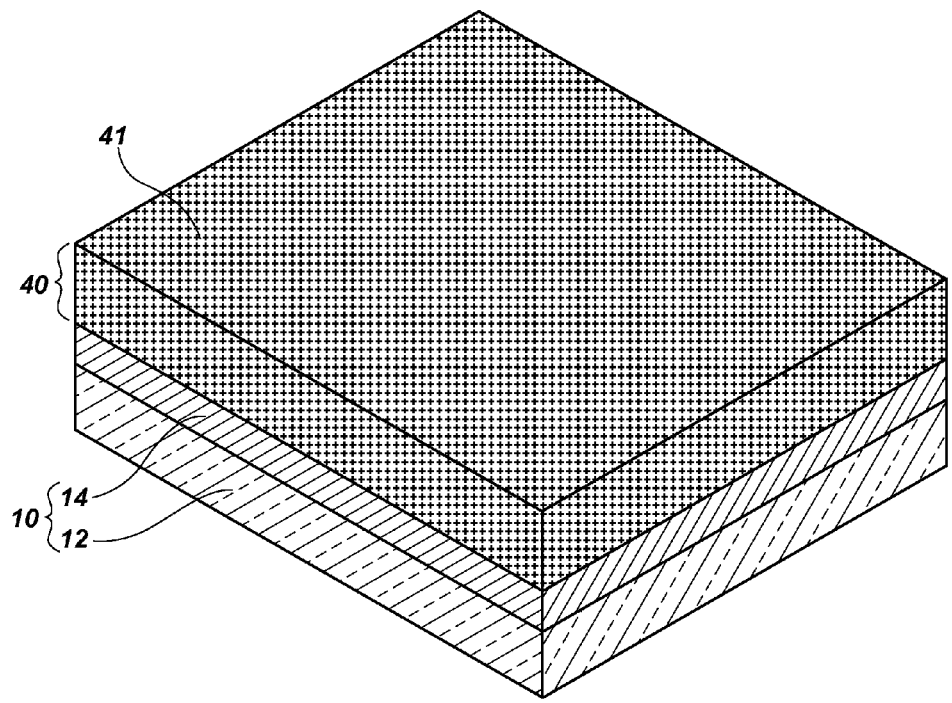
Figure 17B:
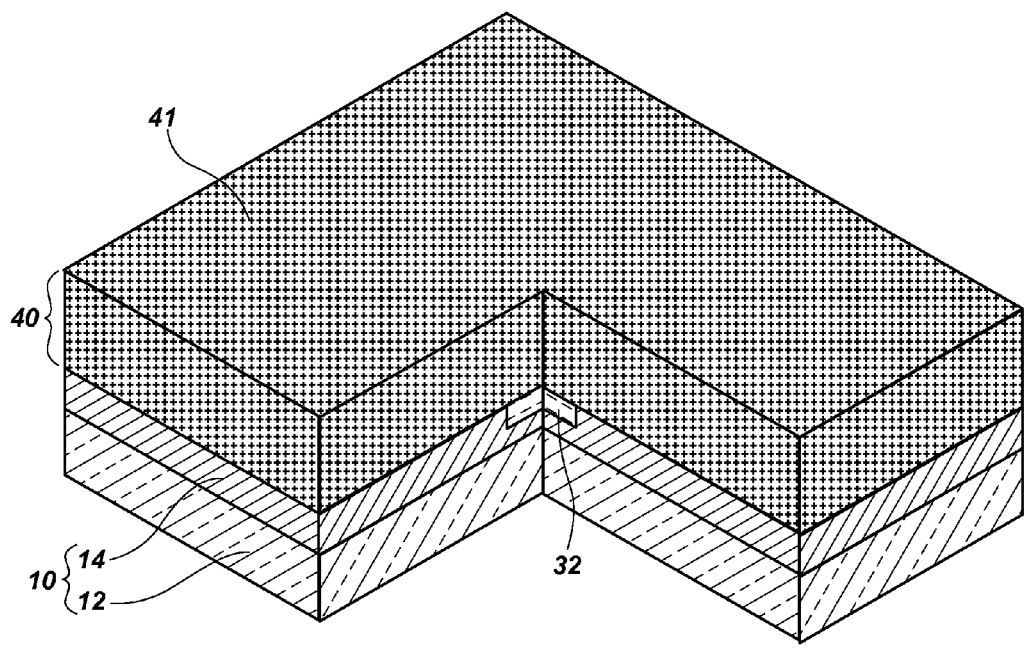
Figure 18A:
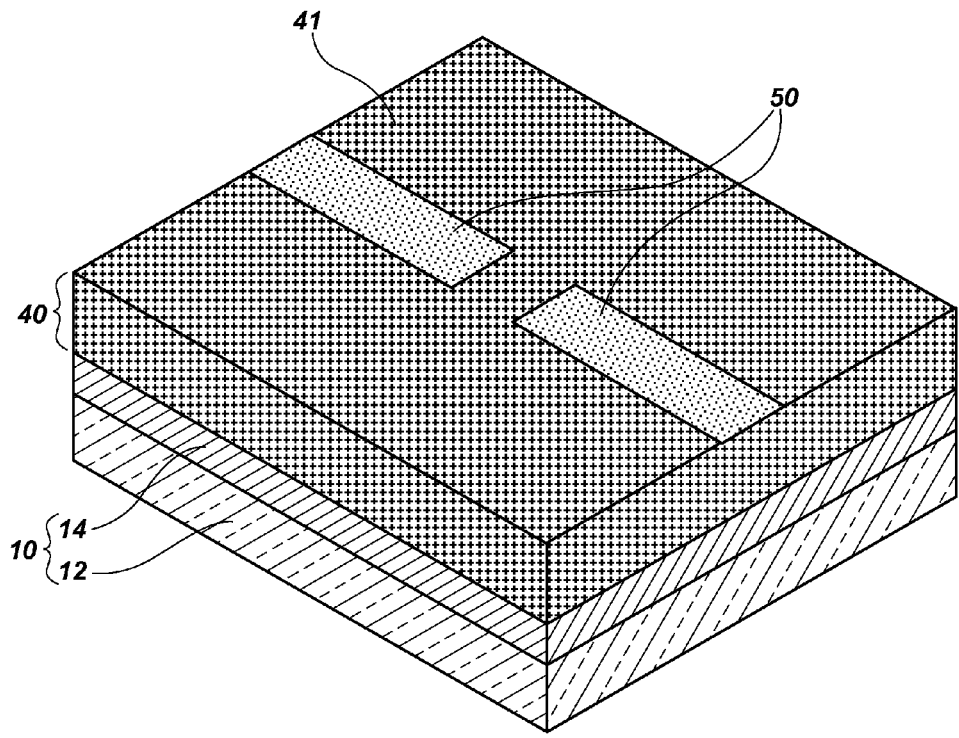
Figure 18B:
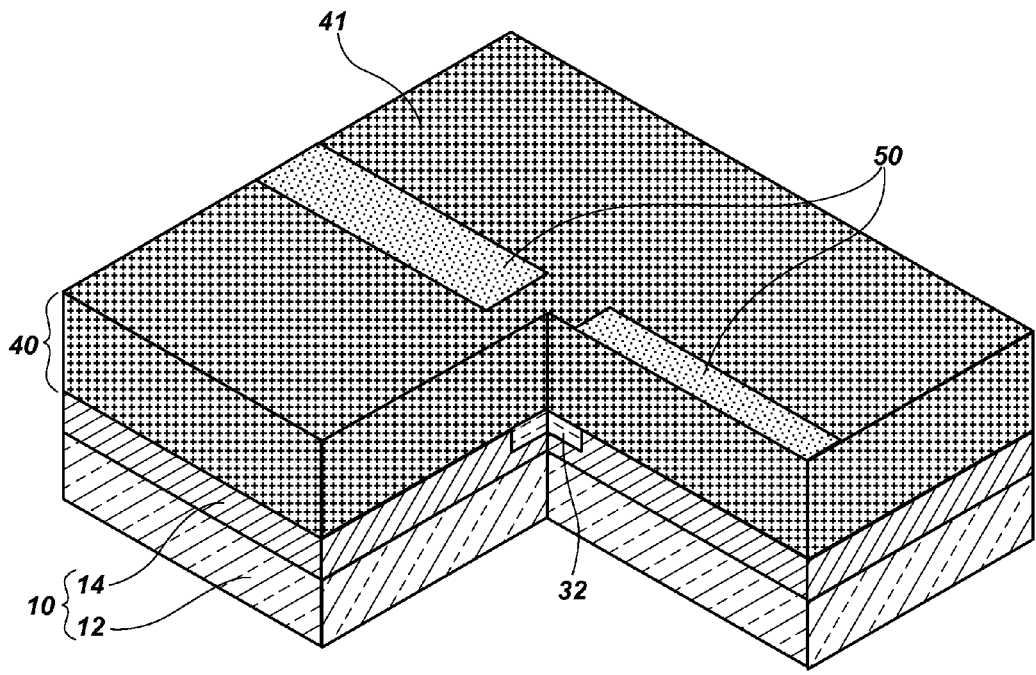

FIGS. 15 through 20B illustrate a method of forming an interrupted resist feature using positive tone development and acidic chemical proximity correction to a segment of exposed patterning resist. With reference to FIGS. 15 and 16, an acidic marker material 32 may be formed in a recess 20. With reference to FIGS. 17A and 17B, a patterning resist 40 that is initially a basic patterning resist 41 may be formed over the acidic marker material 32 and the base material 10. With reference to FIGS. 18A and 18B, the patterning resist 40 may be selectively exposed using a mask 50 that is interrupted, which interruption may be disposed over the acidic marker material 32. A region of acidic patterning resist 42 and regions of basic patterning resist 41 may therefore be defined, as illustrated in FIGS. 19A and 19B.

Figure 19A:
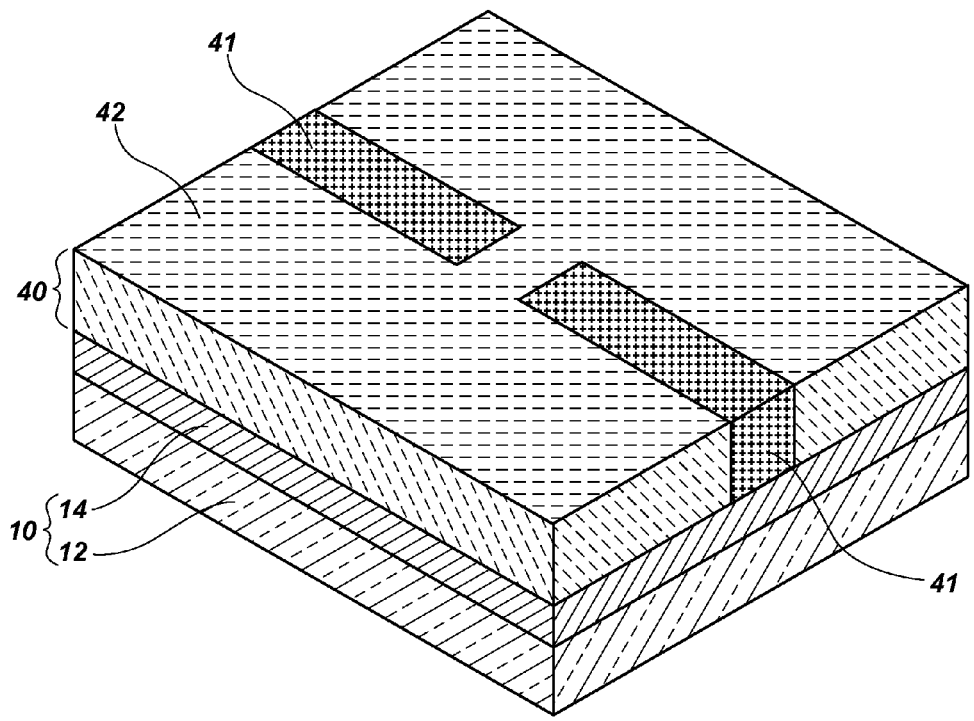
Figure 19B:
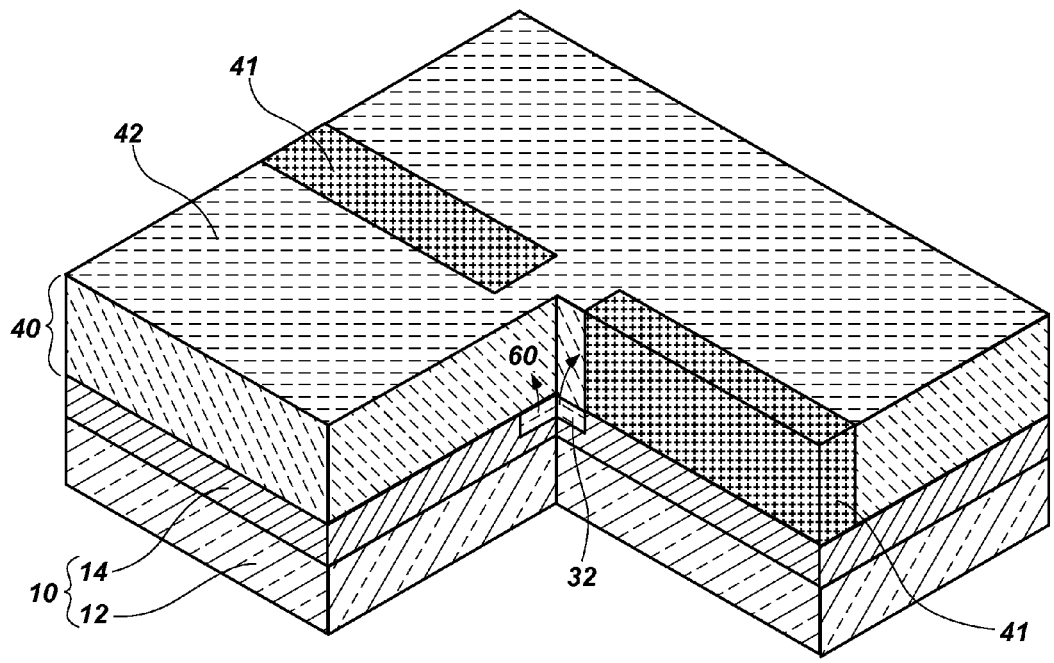
Figure 20A:
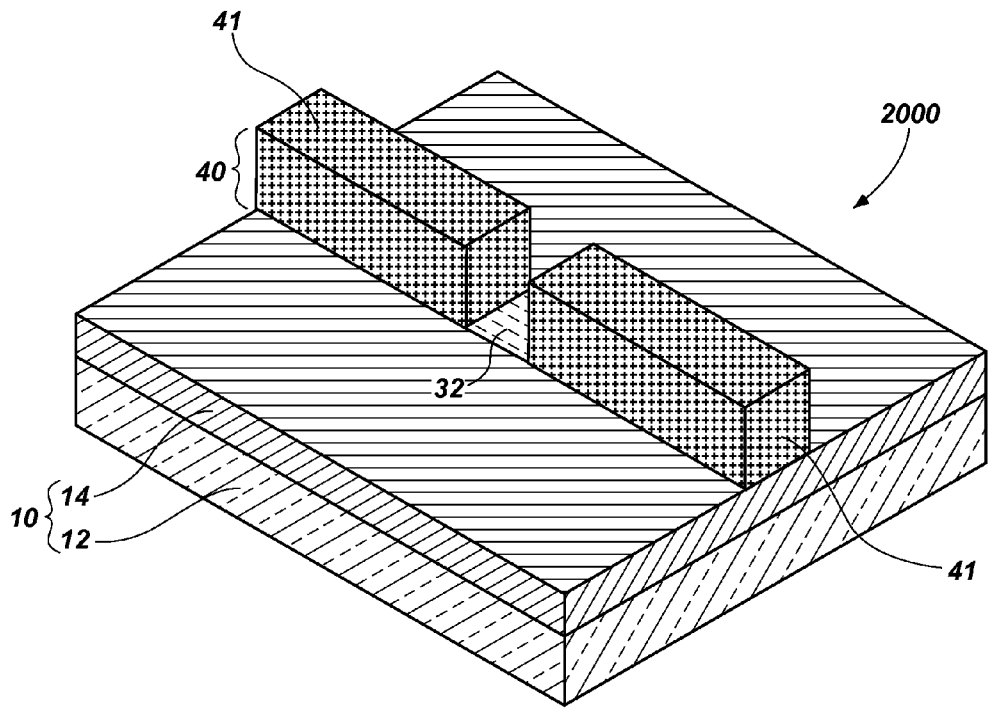
Figure 20B:
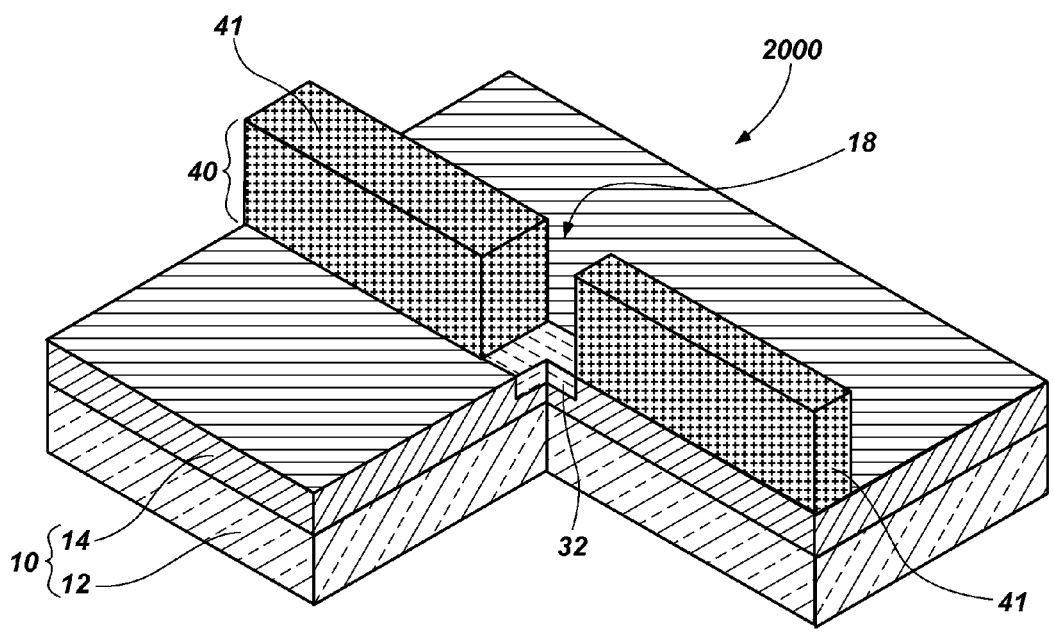

With reference to FIG. 19B, acid from the acidic marker material 32 may be transferred to a lower area of the patterning resist 40 in the direction of arrows 60 to increase the acidity of the segment of patterning resist 40 proximate to the acidic marker material 32, i.e., a segment of the exposed, acidic patterning resist 42. As illustrated in FIGS. 20A and 20B, a positive tone developer, in which the acidic patterning resist 42, including the segment of acid-enhanced patterning resist 40, is soluble and in which the basic patterning resist 41 is not soluble, may be used to develop and remove the acidic patterning resist 42 and acid-enhanced segment of patterning resist 40 to form an interrupted resist feature 2000.

Because the acidic marker material 32 transferred acid to a proximate segment of the patterning resist 40 to encourage development, the patterning resist 40 directly overlying the acidic marker material 32 and portions of the patterning resist 40 nearby may be removed during development, discouraging unwanted line merge. It is contemplated that the amount of acid in the acidic marker material 32 and the conditions for processing may be tailored to achieve an affected segment of desired dimensions. Notably, though FIGS. 20A and 20B illustrate edges of the resulting interrupted resist feature 2000 intersecting with edges of the acidic marker material 32, the resulting interrupted resist feature 2000 may, in other embodiments, include edges that overlie or are disposed more distal from the edges of the acidic marker material 32 than that illustrated in FIGS. 20A and 20B.

Figure 21:
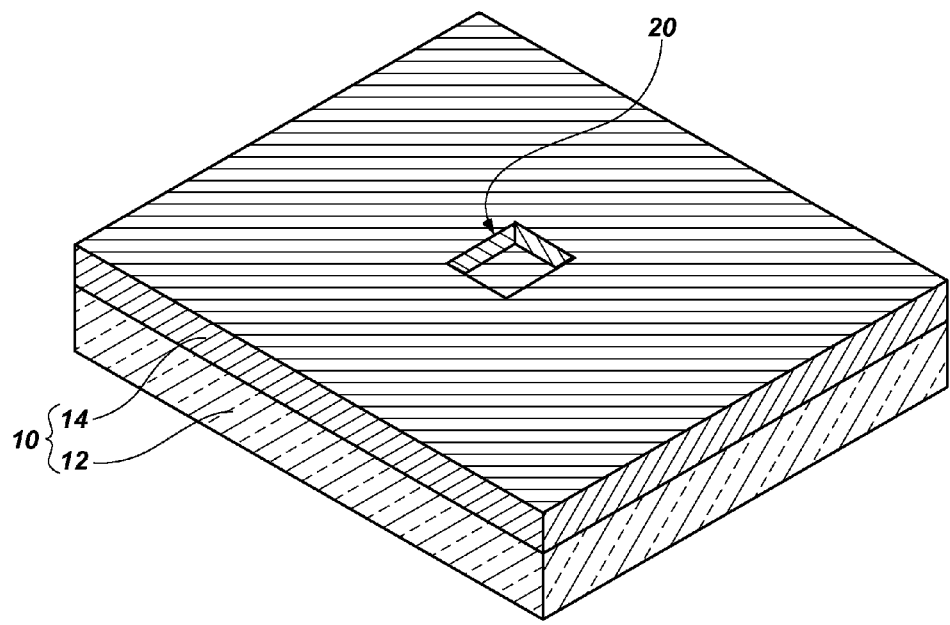
Figure 22:
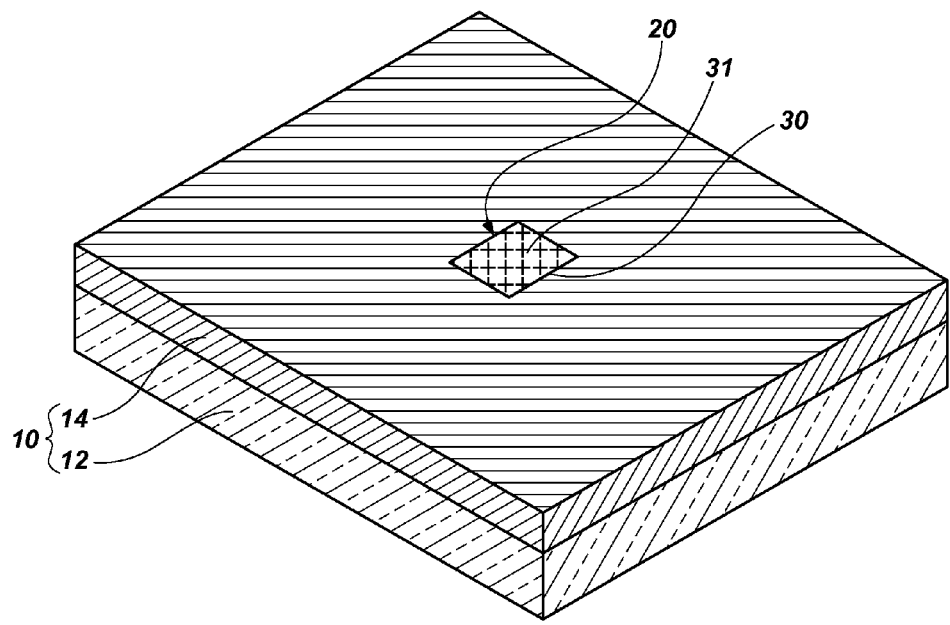
Figure 23A:
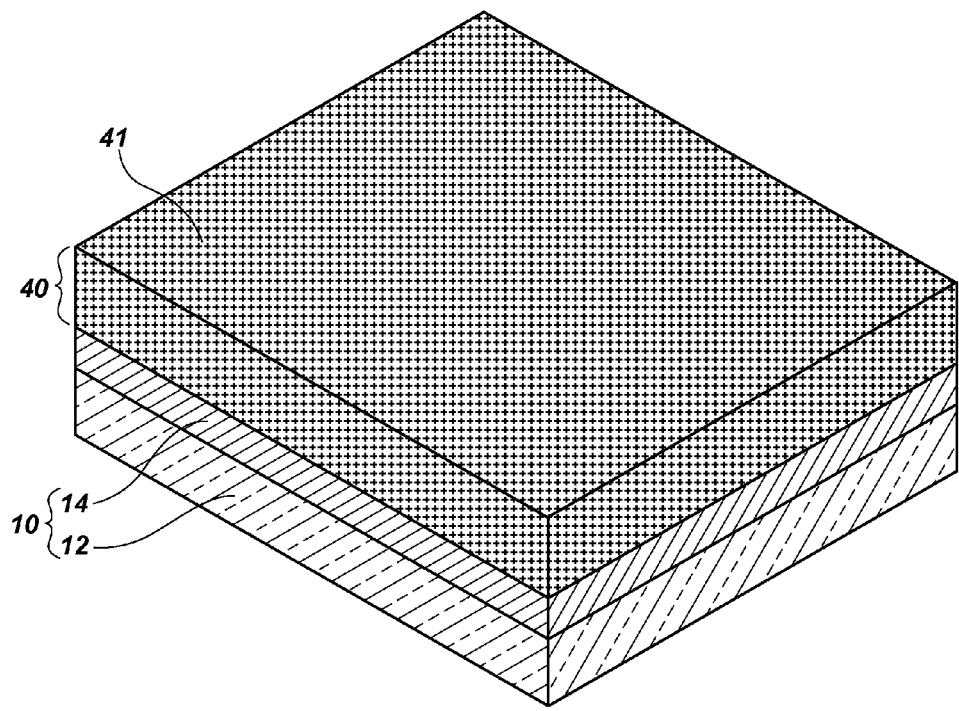
Figure 23B:
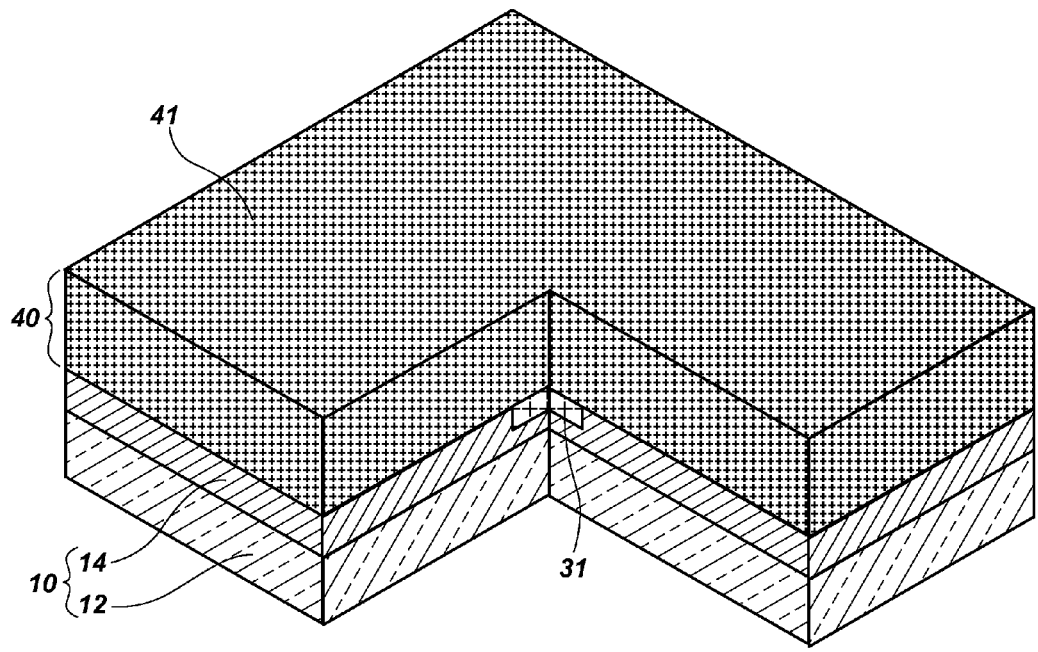
Figure 24A:
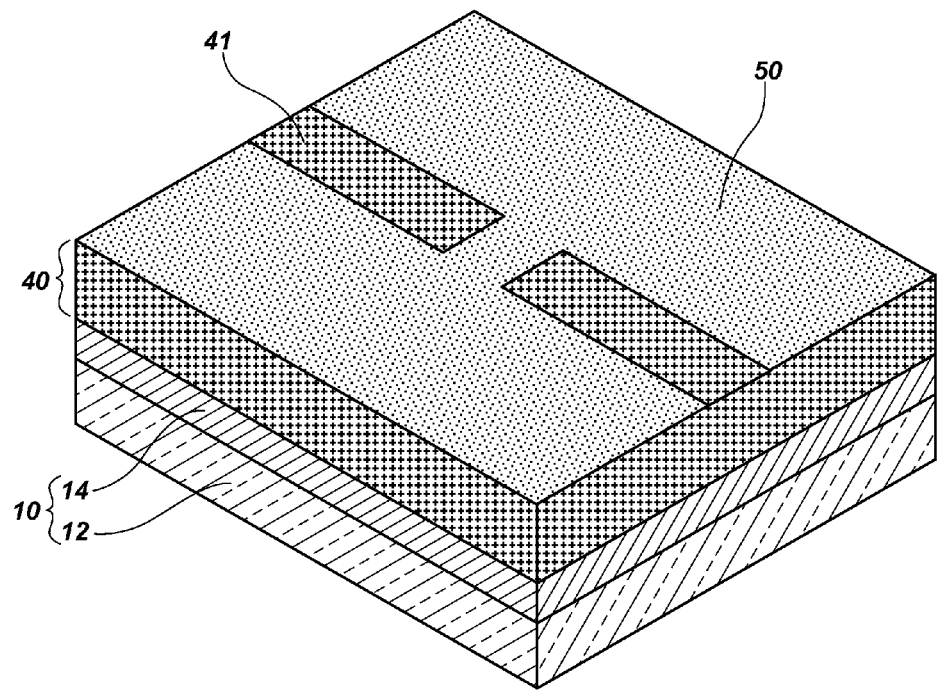
Figure 24B:
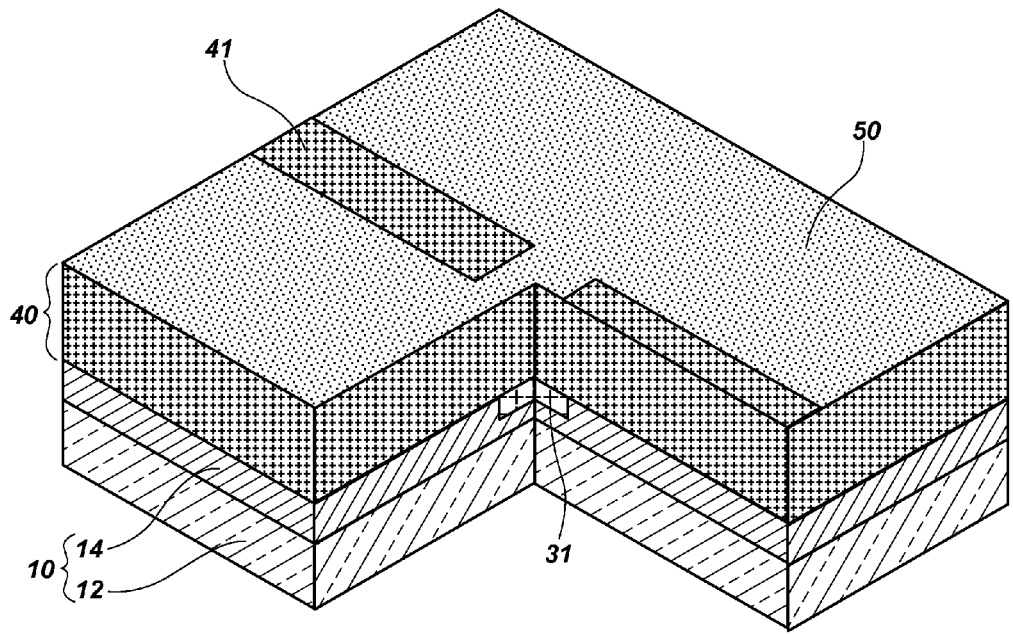

FIGS. 21 through 26B illustrate a method of forming an interrupted resist feature using negative tone development and basic chemical proximity correction on a segment of unexposed patterning resist. With reference to FIGS. 21 and 22, a basic marker material 31 may be formed in a recess 20. With reference to FIGS. 23A and 23B, a patterning resist 40 of basic patterning resist 41 may be formed over the basic marker material 31. As illustrated in FIGS. 24A and 24B, the patterning resist 40 may be selectively exposed using a mask 50 that is interrupted, which interruption may be disposed over the basic marker material 31. Regions of acidic patterning resist 42 and a region of basic patterning resist 41 are therefore defined, as illustrated in FIGS. 25A and 25B.

Figure 25A:
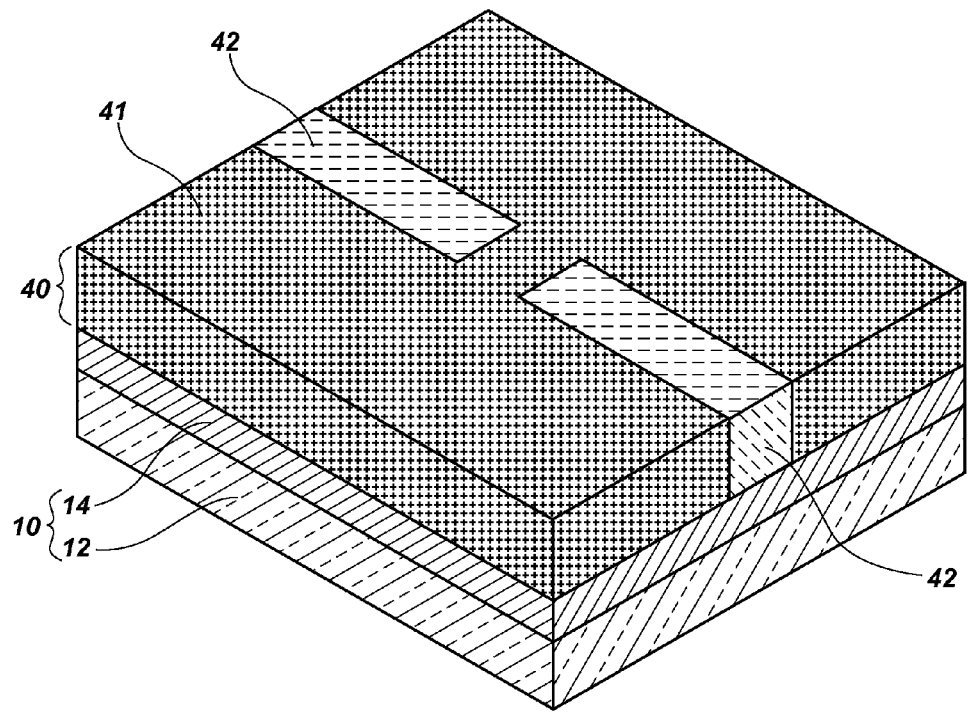
Figure 25B:
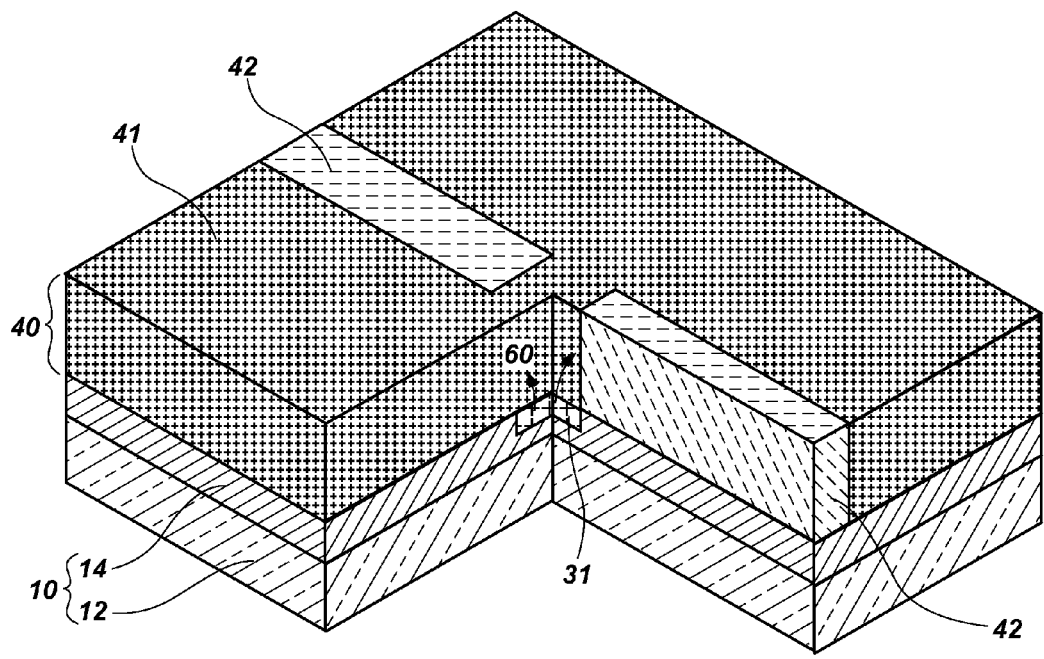
Figure 26A:
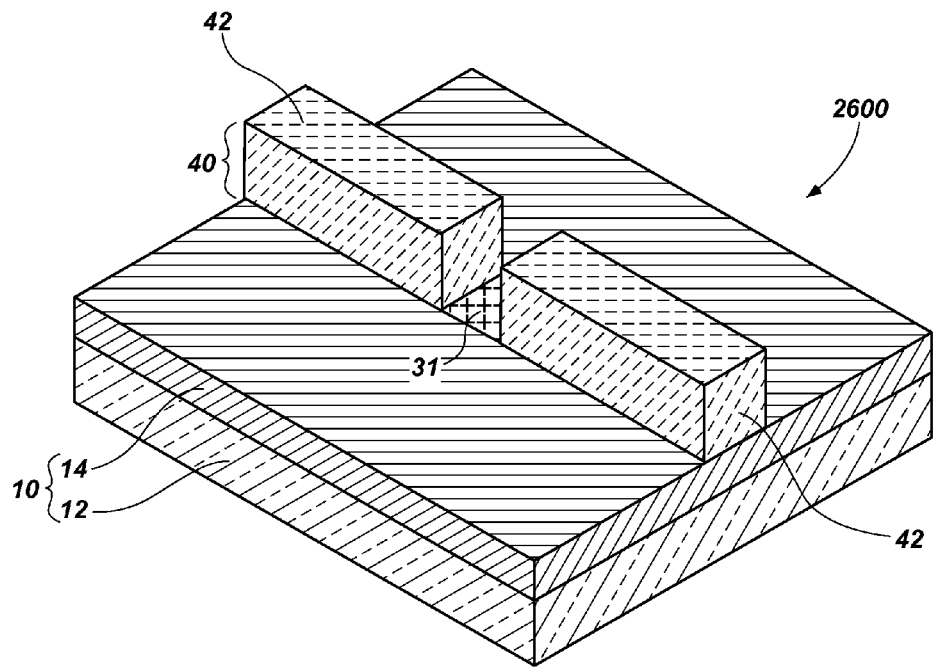
Figure 26B:
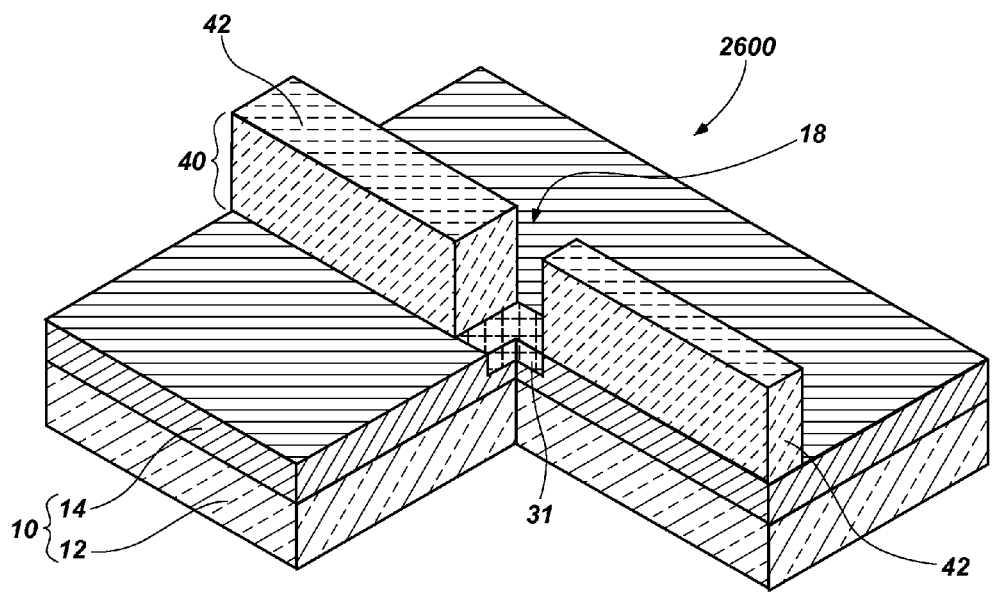

With reference still to FIG. 25B, base from the basic marker material 31 may diffuse into the patterning resist 40 in the direction of arrows 60 to increase the basicity of, i.e., decrease the acidity of, the segment of patterning resist 40 proximate to the basic marker material 31, i.e., the segment of basic patterning resist 41 overlying the basic marker material 31. The miscibility of the segment of base-enhanced patterning resist 40 may therefore be altered. As illustrated in FIGS. 26A and 26B, a negative tone developer may thereafter be used to develop the patterning resist 40 to remove the region of basic patterning material 41, including the segment of patterning resist 40 proximate to the basic marker material 31, forming an interrupted resist feature 2600.

Because the basic marker material 31 transferred base to a proximate segment of the patterning resist 40 to encourage development, the patterning resist 40 directly overlying the basic marker material 31 and portions of the patterning resist 40 nearby may be removed during development, discouraging unwanted line merge. It is contemplated that the amount of base in the basic marker material 31 and the conditions for processing may be tailored to achieve an affected segment of desired dimensions and that the edges of the resulting interrupted resist feature 2600 may overlap, intersect, or not contact the edges of the basic marker material 31.

Accordingly, disclosed is a method of forming a resist feature, the method comprising forming a patterning resist above a marker material supported by a base material. The patterning resist is selectively exposed to define at least one region of exposed resist and at least one region of unexposed resist. An acidity of the at least one region of exposed resist exceeds an acidity of the at least one region of unexposed resist. A compound is diffused from the marker material into the patterning resist to alter at least one of the acidity of a segment of the at least one region of exposed resist and the acidity of a segment of the at least one region of unexposed resist.

Also disclosed is a method of forming a resist feature, the method comprising forming a patterning resist over a base material. Acid or base is added to a lower area of the patterning resist to alter developability of the patterning resist in at least a region proximate to the lower area.

Figure 27:
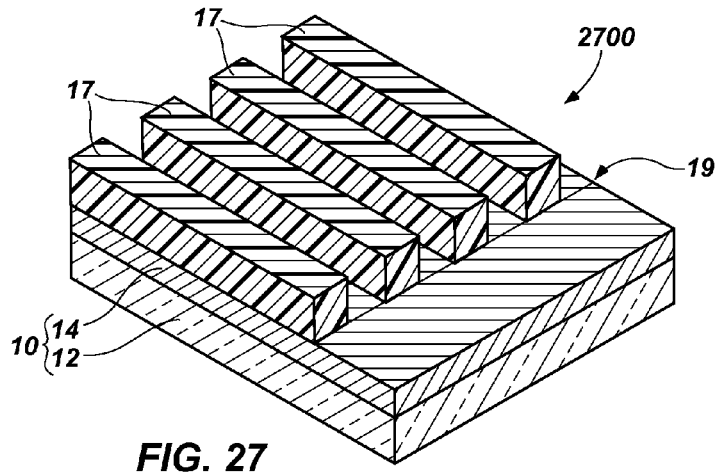
FIG. 27 is an isometric schematic illustration of an array of aligned elongate resist features intended to be formed according to an idealized patterning process.
Figure 28:
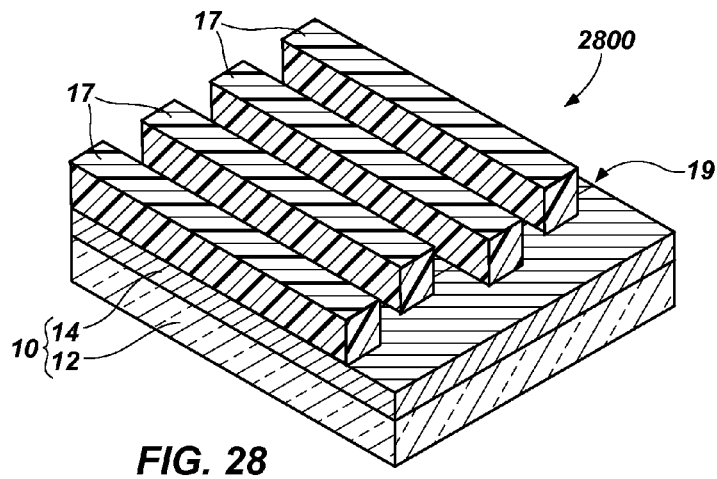
FIG. 28 is an isometric schematic illustration of an array of overlength elongate resist features formed according to a conventional resist patterning process.
Figure 29:
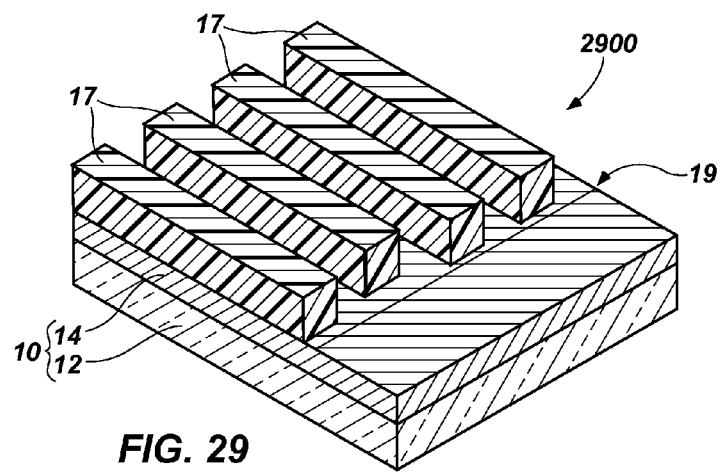
FIG. 29 is an isometric schematic illustration of an array of underlength elongate resist features formed according to a conventional resist patterning process.

A method of forming an array of aligned elongate resist features is also disclosed. FIG. 27 illustrates an array of aligned elongate resist features 2700 in which elongate resist features 17 each terminate in alignment with one another along a border 19. While the uniform alignment exhibited by the array of aligned elongate resist features 2700 is desired, limitations of conventional photolithography processes may produce an array of elongate resist features that are not aligned with one another and the border 19, such as an array of overlength elongate resist features 2800 illustrated in FIG. 28 or such as an array of underlength elongate resist features 2900 illustrated in FIG. 29. Chemical proximity correction techniques according to the present disclosure may be used to achieve a more uniform alignment of the features.

Figure 30:
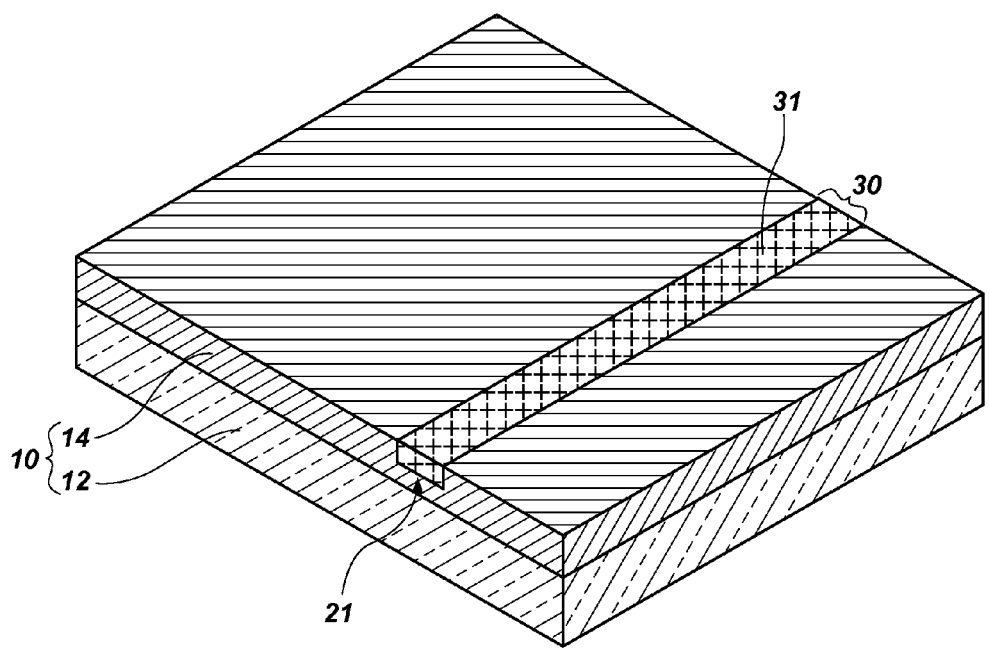
FIGS. 30 through 33 are isometric schematic illustrations of an array of aligned elongate resist features during various stages of processing according to an embodiment of the present disclosure using a positive tone development and basic chemical proximity correction to segments of unexposed patterning resist.

FIGS. 30 through 33 illustrate a method of forming an array of aligned elongate resist features using positive tone development and basic chemical proximity correction to segments of unexposed patterning resist. With reference to FIG. 30, a trench 21 may be formed in the base material 10, e.g., in the hardmask 14. The trench 21 may be formed along an area corresponding to a portion of the base material 10 at which the elongate resist features to be formed are desired to be in alignment, e.g., at border 19 of FIGS. 27 through 29. The trench 21 may be a shallow trench of depth and dimensions similar to those of the recess 20 (e.g., FIG. 3) described above.

Figure 31:
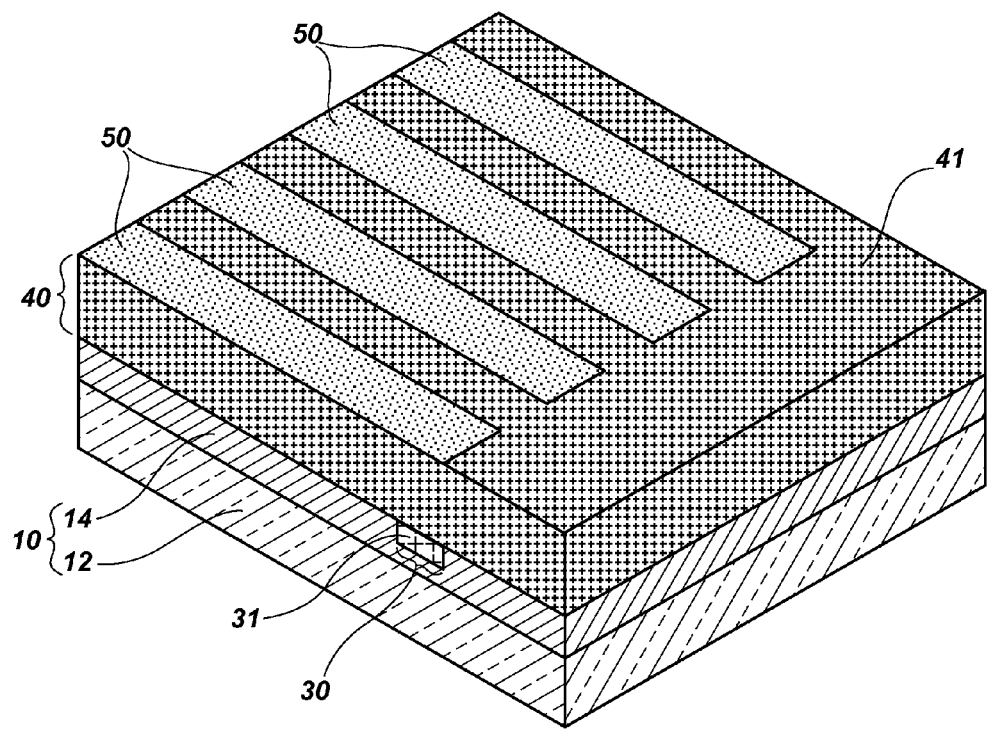
Figure 32:
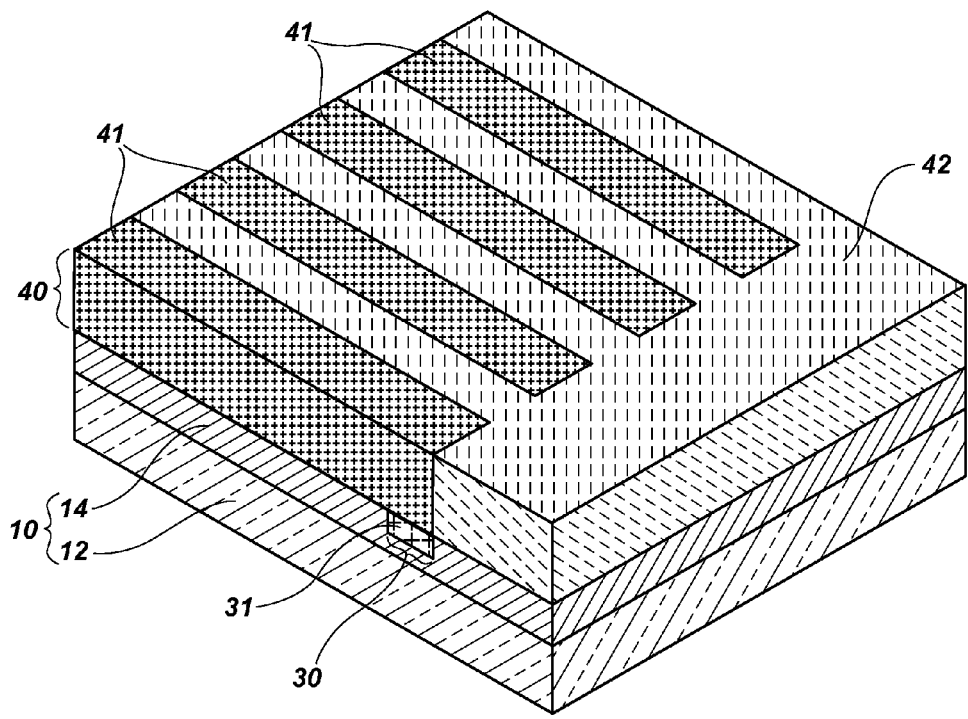

A marker material 30, which may be formulated as a basic marker material 31, may be formed in the trench 21. As illustrated in FIG. 31, a patterning material 40 may be formed thereover and masked using a mask 50 defining regions of the patterning material 40 to be exposed and, accordingly, regions of the patterning material 40 to remain as unexposed, basic patterning resist 41. With reference to FIG. 32, the selective exposure forms at least one region of exposed, acidic patterning resist 42 surrounding defined regions, corresponding to the desired features of the elongate resist features to be formed, of basic patterning resist 41. As discussed above with regard to FIG. 7B, base may diffuse from the basic marker material 31 into proximate segments of the patterning material 40, e.g., the patterning material 40 overlying and disposed near to the basic marker material 31. This base diffusion may enhance the basicity of segments of basic patterning resist 41 overlying the basic marker material 31. However, the marker material 30 may be formulated such that base diffused from the basic marker material 31 into proximate segments of the acidic patterning resist 42 may not be sufficient to effectively convert the segments of the acidic patterning resist 42 into basic patterning resist 41, i.e., less base may be transferred from the basic marker material 31 into the proximate segments of acidic patterning resist 42 than would be necessary to increase the pH in the proximate segments of acidic patterning resist 42 to a point in which the solubility of the proximate segments in a developer to be used is changed between soluble and insoluble. Therefore, the transfer of base from the basic marker material 31 to proximate segments of the patterning resist 40 may discourage unwanted development of the segments of the basic patterning resist 41 regions proximate to the basic marker material 31 without effectively preventing development of the segments of the acidic patterning resist 42 region proximate to the basic marker material 31.

Figure 33:
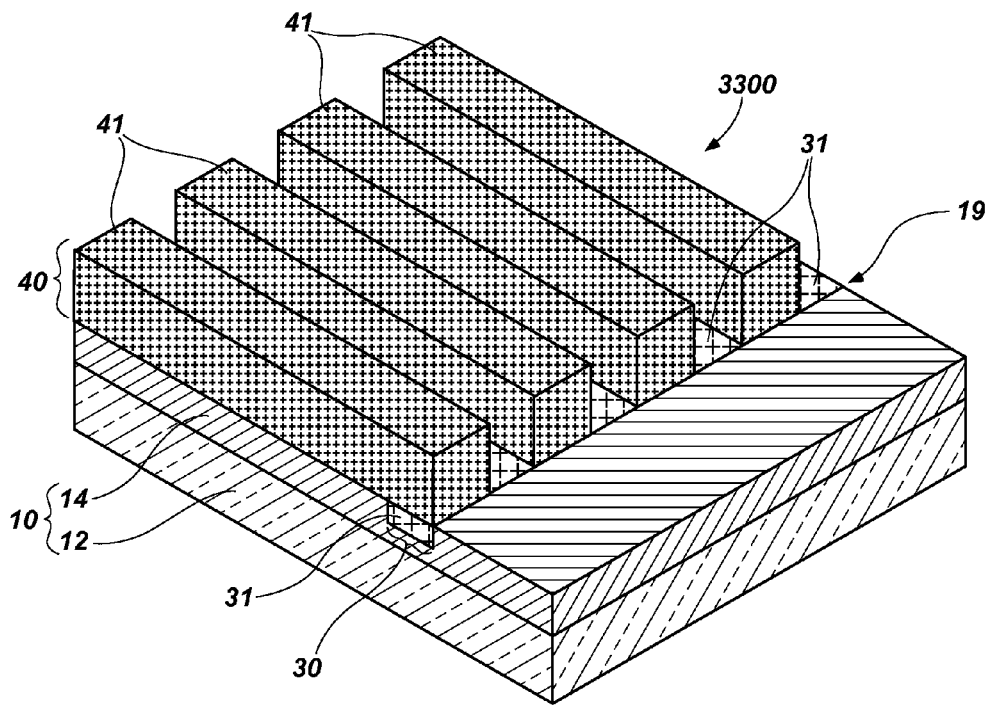

As illustrated in FIG. 33, following development with a positive tone developer, selective for the acidic patterning resist 42, an array of aligned, elongate resist features 3300 is formed from the remaining basic patterning resist 41, including the base-enhanced segments of the basic patterning resist 41 proximate to the basic marker material 31. Because the basic marker material 31 transferred base to proximate segments of the patterning resist 40 to discourage development of proximate segments of basic patterning resist 41 without effectively inhibiting development of proximate segments of acidic patterning resist 42, segments of basic patterning resist 41 directly overlying and disposed near the basic marker material 31 may not be removed during development, discouraging unwanted underlength elongate features, such as those illustrated in FIG. 29. Rather, each of the elongate resist features of the array 3300 may terminate proximate to the border 19 marked by the basic marker material 31. For example, the elongate resist features of the array 3300 may each terminate near a distal edge of the basic marker material 31.

Figure 34:
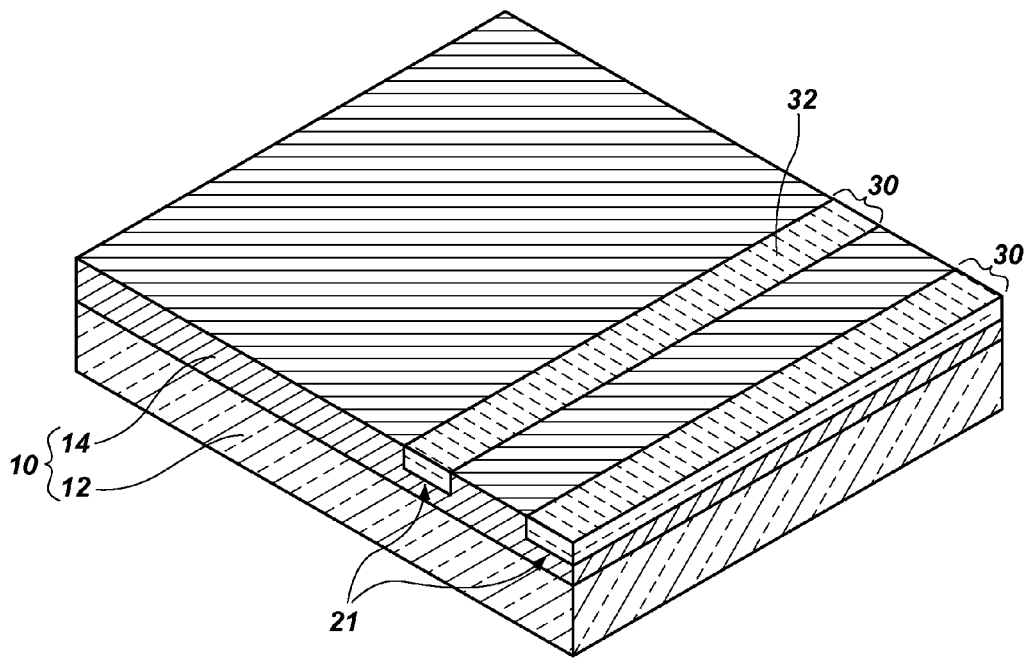
FIGS. 34 through 37 are isometric schematic illustrations of an array of aligned elongate resist features during various stages of processing according to an embodiment of the present disclosure using a negative tone development and acidic chemical proximity correction to segments of exposed patterning resist.
Figure 35:
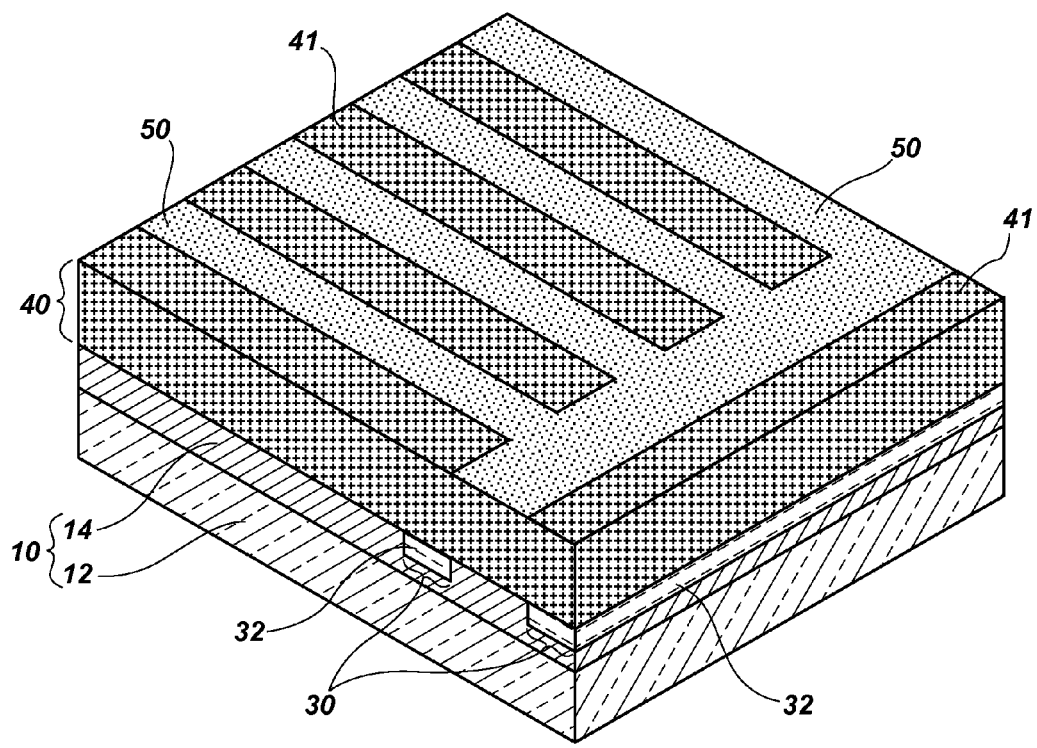
Figure 36:
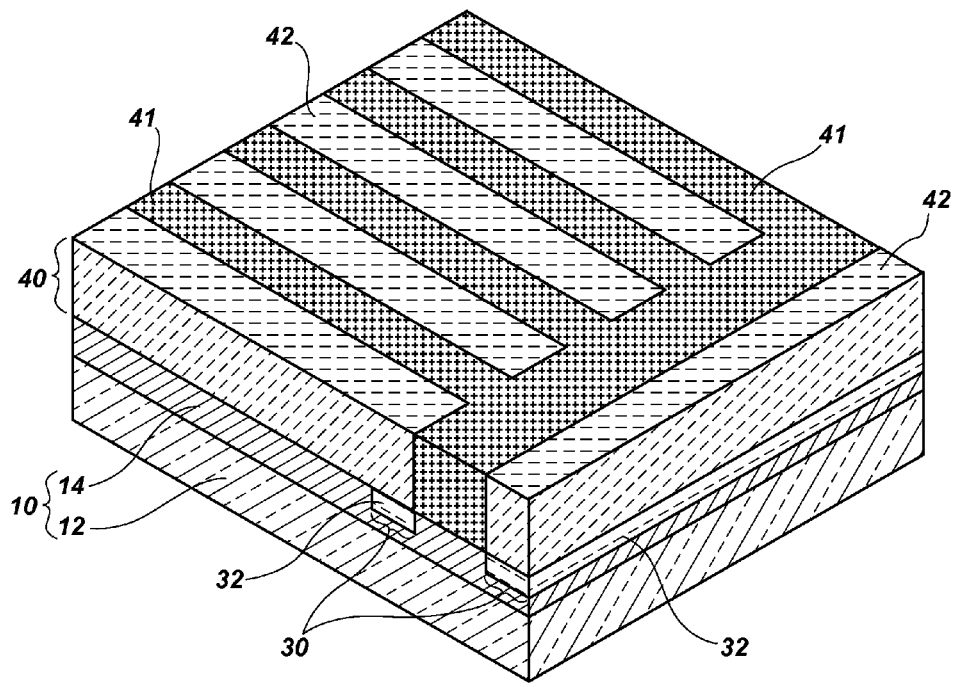

FIGS. 34 through 37 illustrate a method of forming an array of aligned elongate resist features using negative tone development and acidic chemical proximity correction to segments of exposed patterning resist. With reference to FIG. 34, an acidic marker material 32 may be formed in trenches 21 defined in the base material 10. With reference to FIG. 35, a patterning resist 40 may be formed thereover and selectively exposed using a mask 50. As illustrated in FIG. 36, the selective exposure forms regions of acidic patterning resist 42 and a region of basic patterning resist 41. As discussed above with regard to FIG. 13B, acid may diffuse from the acidic marker material 32 into proximate segments of the patterning material 40, e.g., the patterning material 40 overlying and disposed near to the acidic marker material 32. This acid diffusion may enhance the acidity of the segments of acidic patterning resist 42 overlying the acidic marker material 32. However, the marker material 30 may be formulated such that acid diffused from the acidic marker material 32 into proximate segments of basic patterning resist 41 may not be sufficient to effectively convert the proximate segments of basic patterning resist 41 into acidic patterning resist 42, i.e., less acid may be transferred from the acid marker material 32 into the proximate segments of basic patterning resist 41 than would be necessary to decrease the pH in the proximate segments of basic patterning resist 41 to a point in which the solubility of the proximate segments in a developer to be used is changed between soluble and insoluble. Therefore, the transfer of acid from the acidic marker material 32 to proximate segments of the patterning resist 40 may discourage unwanted development of the segments of the acidic patterning resist 42 regions proximate to the acidic marker material 32 without effectively preventing development of the segments of the basic patterning resist 41 region proximate to the acidic marker material 32.

Figure 37:
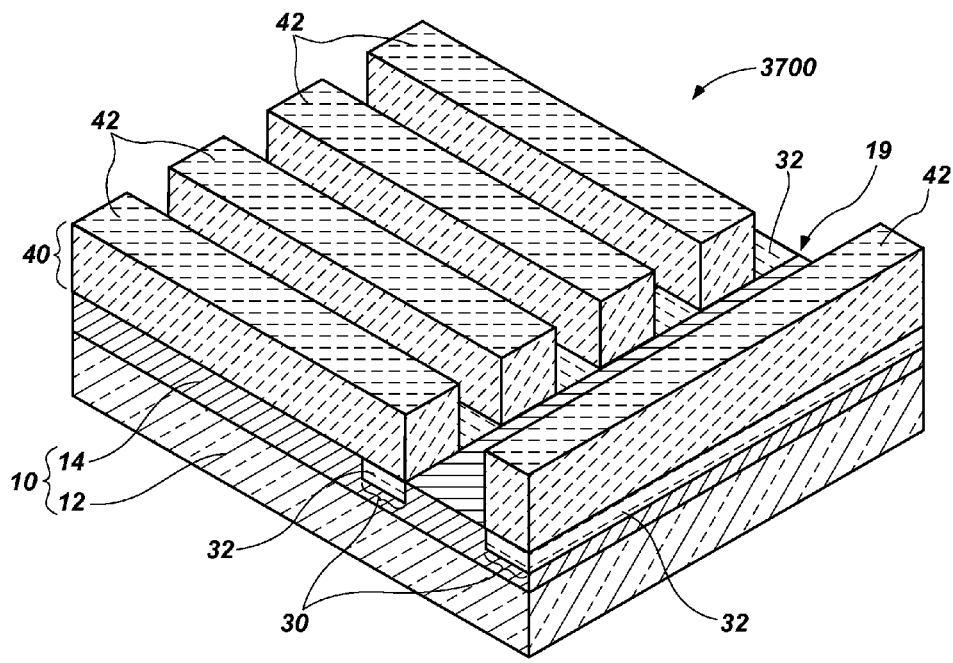

As illustrated in FIG. 37, following development with a negative tone developer, selective for the basic patterning resist 41, an array of aligned, elongate resist features 3700 is formed from the remaining acidic patterning resist 42, including the acid-enhanced segments of the acidic patterning resist 42 proximate to the acidic marker material 32. Because the acidic marker material 32 transferred acid to proximate segments of the patterning resist 40 to discourage development of proximate segments of acidic patterning resist 42 without effectively inhibiting development of proximate segments of basic patterning resist 41, segments of acidic patterning resist 42 directly overlying and disposed near the acidic marker material 32 may not be removed during development, discouraging unwanted underlength elongate features, such as those illustrated in FIG. 29. Rather, each of the elongate features of the array 3700 may terminate proximate to the border 19 marked by the acidic marker material 32. For example, the elongate resist features of the array 3700 may each terminate near a distal edge of the acidic marker material 32.

Figure 38:
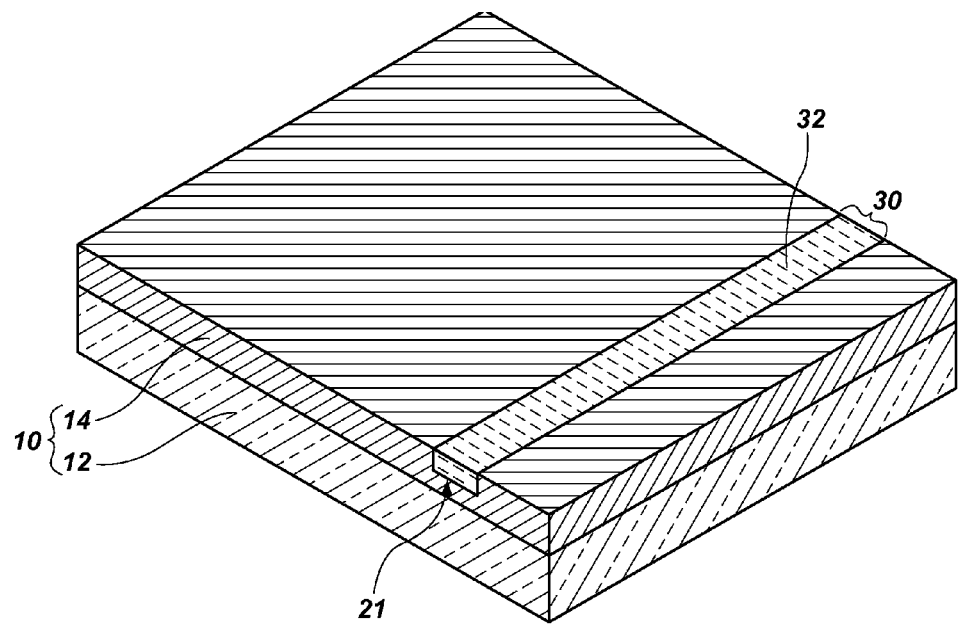
FIGS. 38 through 41 are isometric schematic illustrations of an array of aligned elongate resist features during various stages of processing according to an embodiment of the present disclosure using a positive tone development and acidic chemical proximity correction to segments of exposed patterning resist.
Figure 39:
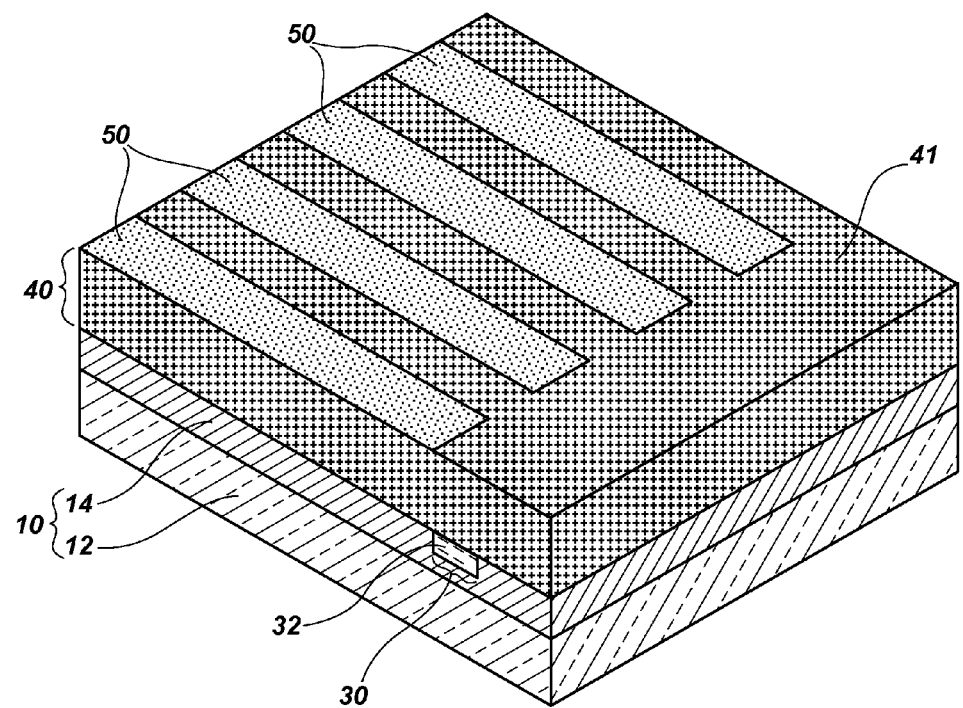
Figure 40:
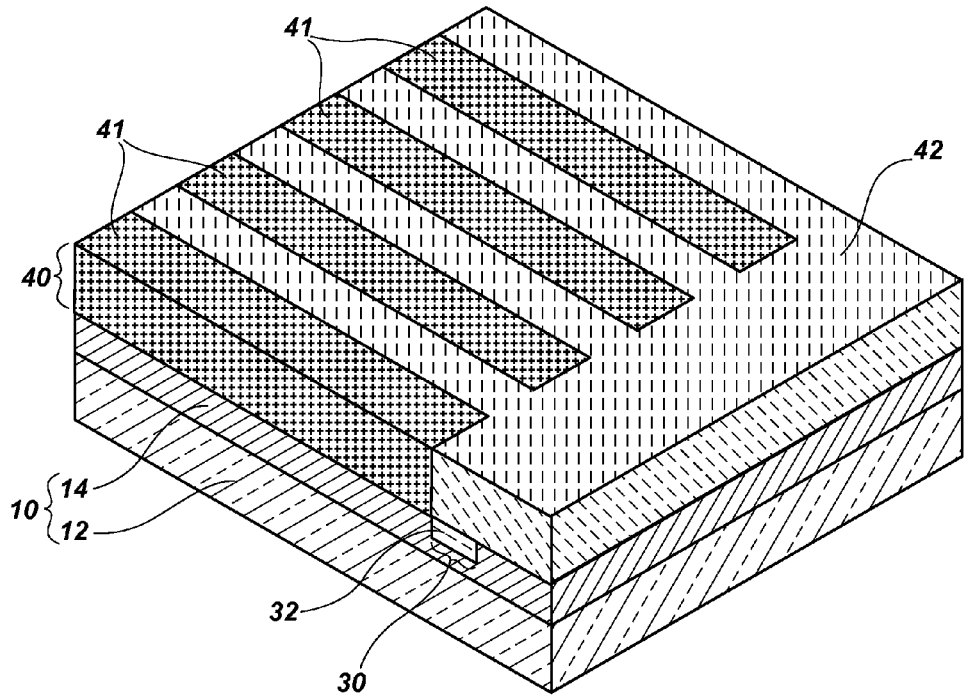

FIGS. 38 through 41 illustrate a method of forming an array of aligned elongate resist features using positive tone development and acidic chemical proximity correction to segments of exposed patterning resist. With reference to FIG. 38, an acidic marker material 32 may be formed in a trench 21 defined in the base material 10. With reference to FIG. 39, a patterning resist 40 may be formed thereover and selectively exposed using a mask 50. As illustrated in FIG. 40, the selective exposure forms a region of acidic patterning resist 42 and regions of basic patterning resist 41. As discussed above with regard to FIG. 19B, acid may diffuse from the acidic marker material 32 into a proximate segment of the patterning material 40, i.e., the overlying segment of acidic patterning resist 42, to enhance the acidity of the proximate segment of acidic patterning resist 42. Therefore, the transfer of acid from the acidic marker material 32 to the proximate segment of the patterning resist 40 may encourage development of the acidic patterning resist 42 proximate to the acidic marker material 32.

Figure 41:
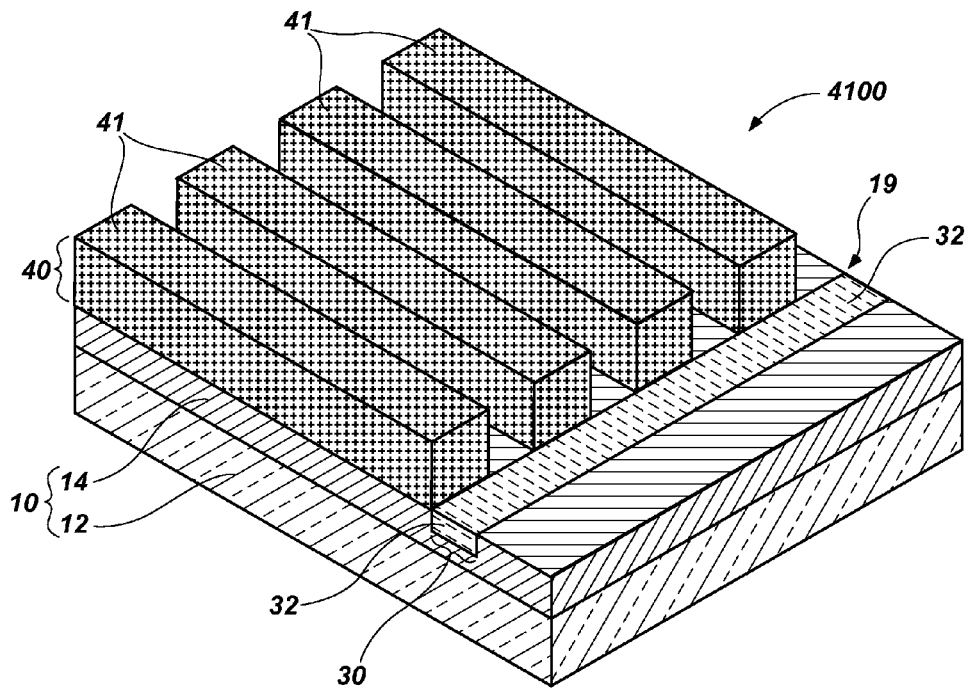

As illustrated in FIG. 41, following development with a positive tone developer, selective for the acidic patterning resist 42, including the acid-enhanced segment proximate to the acidic marker material 32, an array of aligned, elongate resist features 4100 is formed from the remaining basic patterning resist 41. Because the acidic marker material 32 transferred acid to the proximate segment of the patterning resist 40 to encourage the development of the proximate segment, segments of the basic patterning resist 41 may not overlie the boundary 19 marked by the acidic marker material 32, discouraging unwanted overlength elongate resist features, such as those illustrated in FIG. 28. Rather, each of the elongate features of the array 4100 may terminate proximate to the border 19, e.g., near a proximate edge of the acidic marker material 32.

Figure 42:
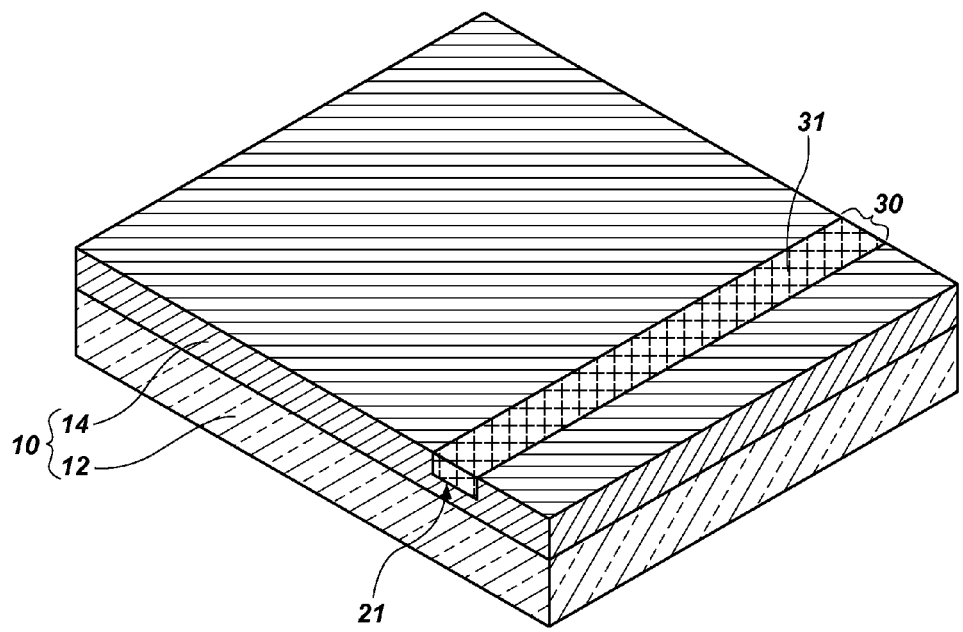
FIGS. 42 through 45 are isometric schematic illustrations of an array of aligned elongate resist features during various stages of processing according to an embodiment of the present disclosure using a negative tone development and basic chemical proximity correction to segments of unexposed patterning resist.
Figure 43:
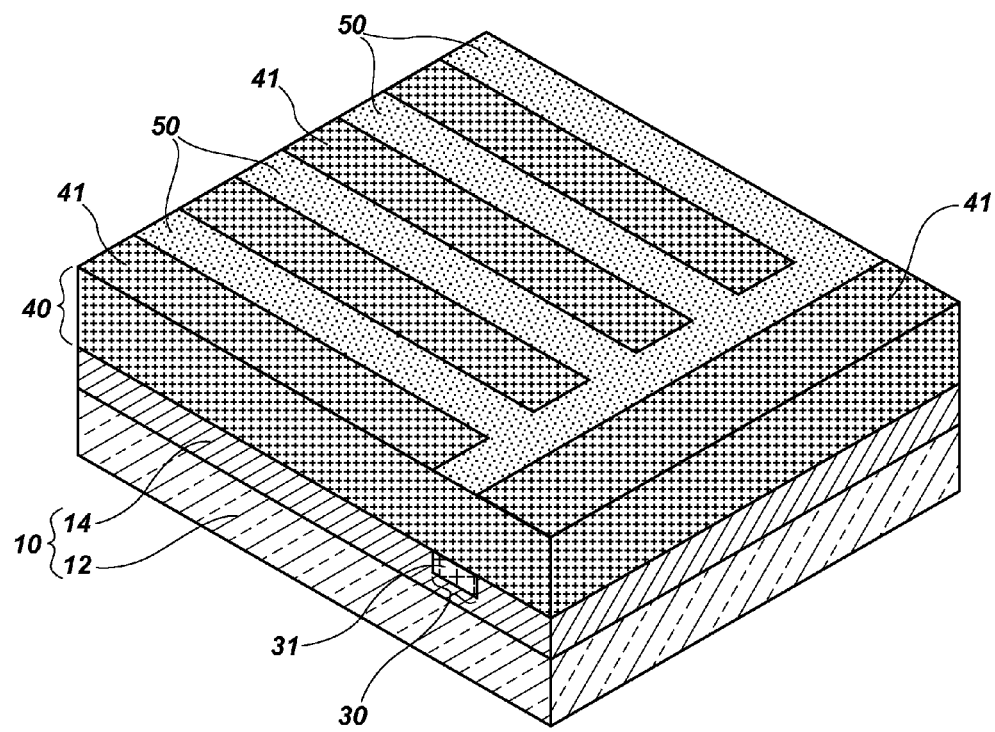
Figure 44:
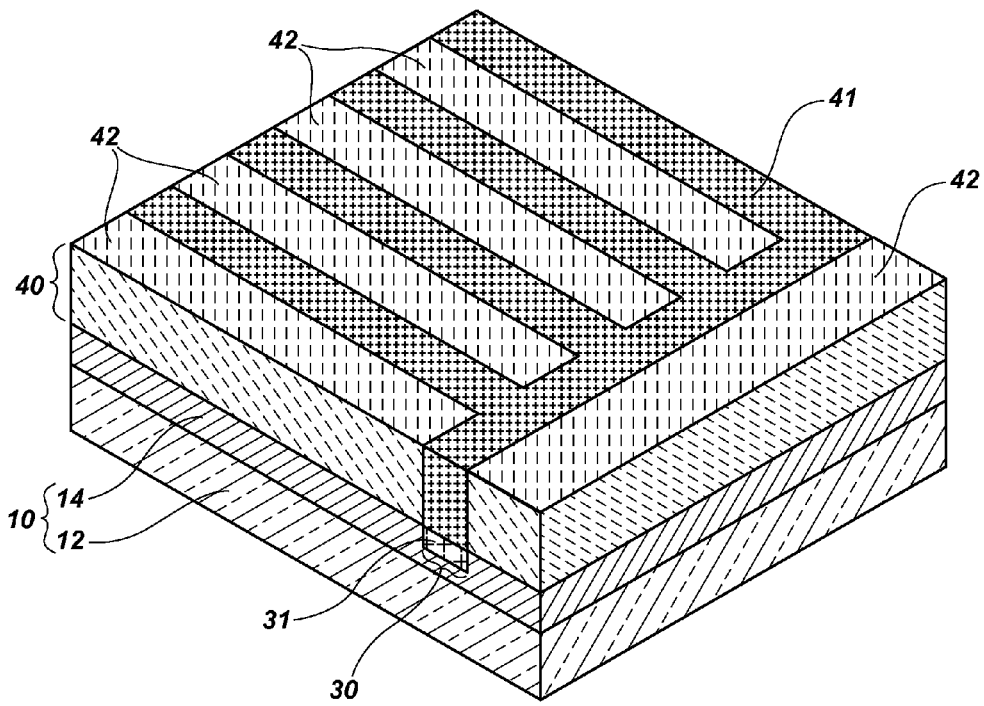

FIGS. 42 through 45 illustrate a method of forming an array of aligned elongate resist features using negative tone development and basic chemical proximity correction to segments of unexposed patterning resist. With reference to FIG. 42, a basic marker material 31 may be formed in a trench 21 defined in the base material 10. With reference to FIG. 43, a patterning resist 40 may be formed thereover and selectively exposed using a mask 50. As illustrated in FIG. 44, the selective exposure forms regions of acidic patterning resist 42 and a region of basic patterning resist 41. As discussed above with regard to FIG. 25B, base may diffuse from the basic marker material 31 into a proximate segment of the patterning material 40, i.e., the overlying segment of basic patterning resist 41, to decrease the acidity of the proximate segment of basic patterning resist 41. Therefore, transfer of base from the basic marker material 31 to the proximate segment of the patterning resist 40 may encourage development of the basic patterning resist 41 proximate to the basic marker material 31.

Figure 45:
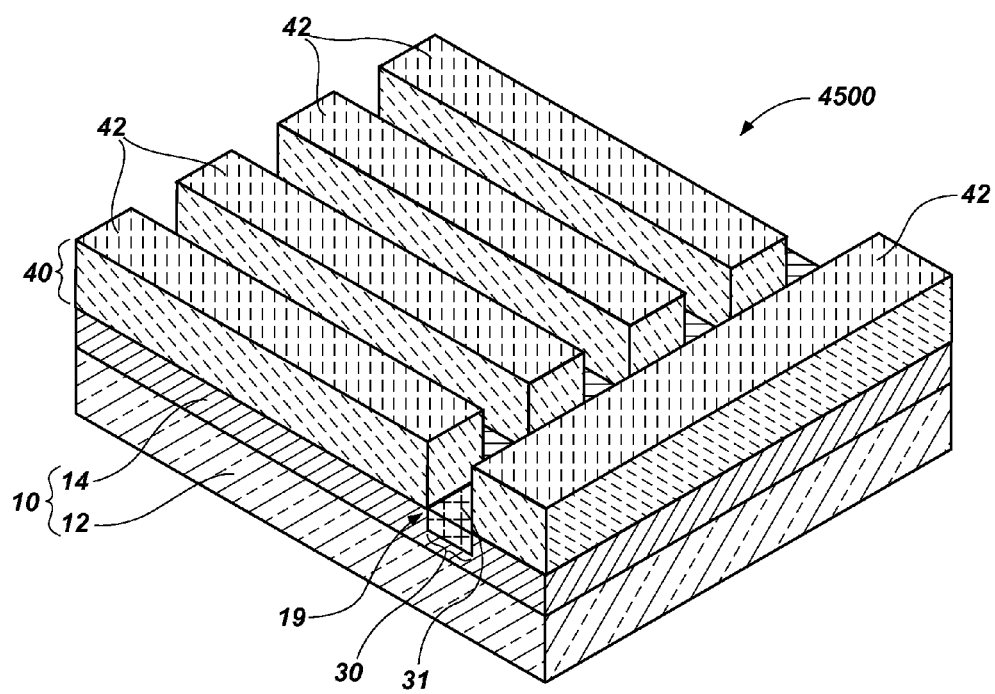
Figure 46:
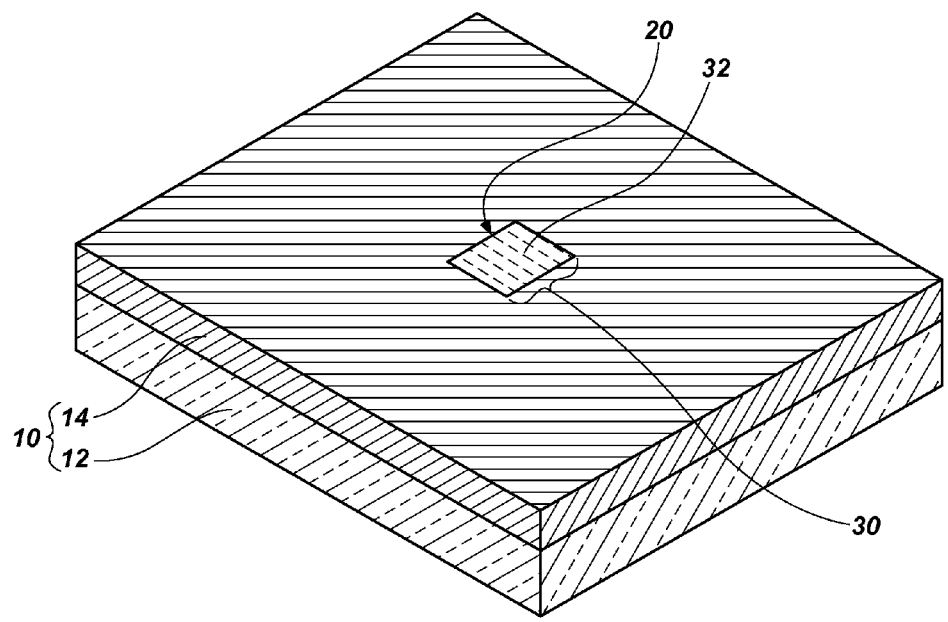
Figure 47:
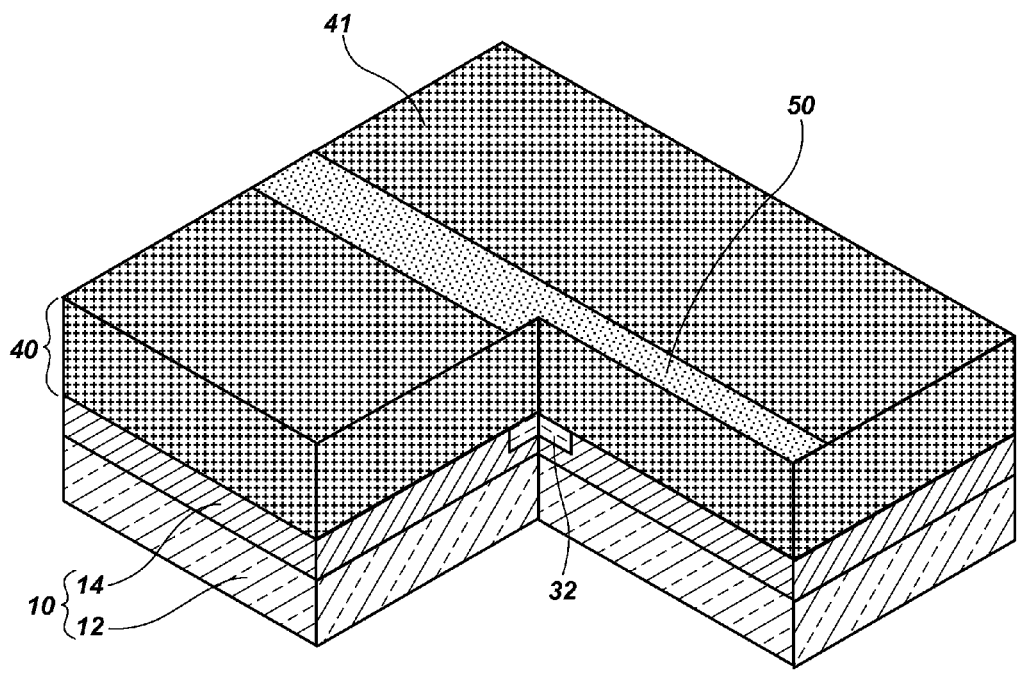
Figure 48:
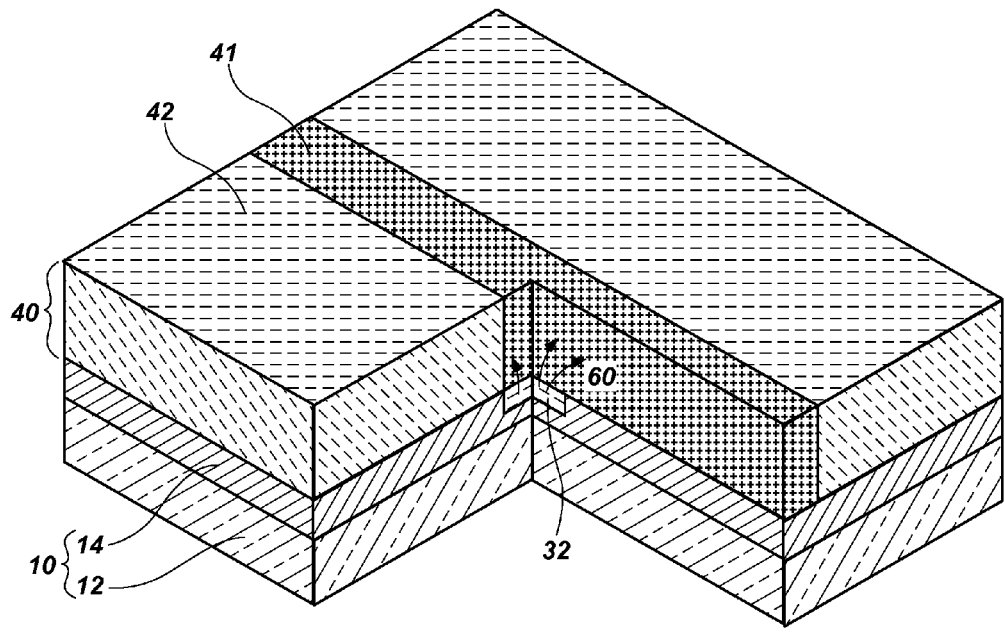

As illustrated in FIG. 45, following development with a negative tone developer, selective for the basic patterning resist 41, including the base-enhanced segment proximate to the basic marker material 31, an array of aligned, elongate resist features 4500 is formed from the remaining acidic patterning resist 42. Because the basic marker material 31 transferred base to the proximate segment of the patterning resist 40 to encourage development of the proximate segment, segments of the acidic patterning resist 42 may not overlie the boundary 19 marked by the basic marker material 31, discouraging unwanted overlength elongate resist features, such as those illustrated in FIG. 28. Rather, each of the elongate features of the array 4500 may terminate proximate to the border 19, e.g., near a proximate edge of the basic marker material 31.

Accordingly, disclosed is a method of forming an array of aligned elongate resist feature, the method comprising forming a discrete feature of a marker material supported by a base material. A patterning resist is formed over the base material. At least one of an acid and a base is transferred from the marker material to a region of the patterning resist proximate to the discrete feature of the marker material to increase or decrease developability of the region of the patterning resist relative to another region of the patterning resist. The patterning resist is selectively exposed and developed to define an array of elongate resist features. A plurality of the elongate resist features of the array terminate in substantial alignment proximate to the discrete feature of the marker material.

Chemical proximity correction techniques of the present disclosure may also be used to effectively convert an exposed, acidic segment of resist to a basic segment or to effectively convert an unexposed, basic segment of resist to an acidic segment, chemically altering the developability of the segment. Therefore, segments masked for exposure may be chemically converted to exhibit developability similar to that of unexposed regions, and segments masked not to be exposed may be chemically converted to exhibit developability similar to that of exposed regions.

Figure 49:
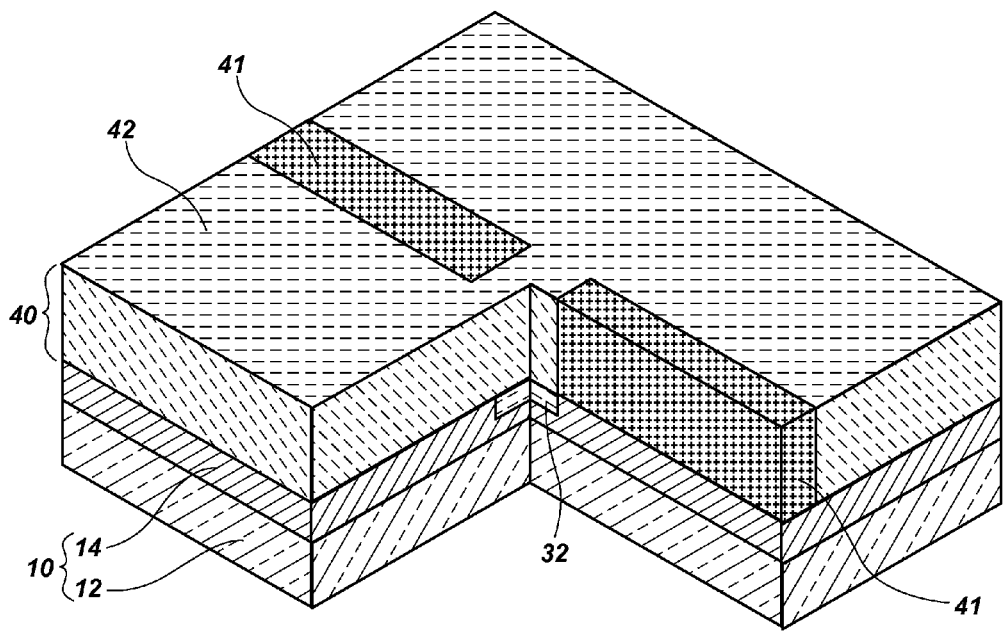
Figure 50:
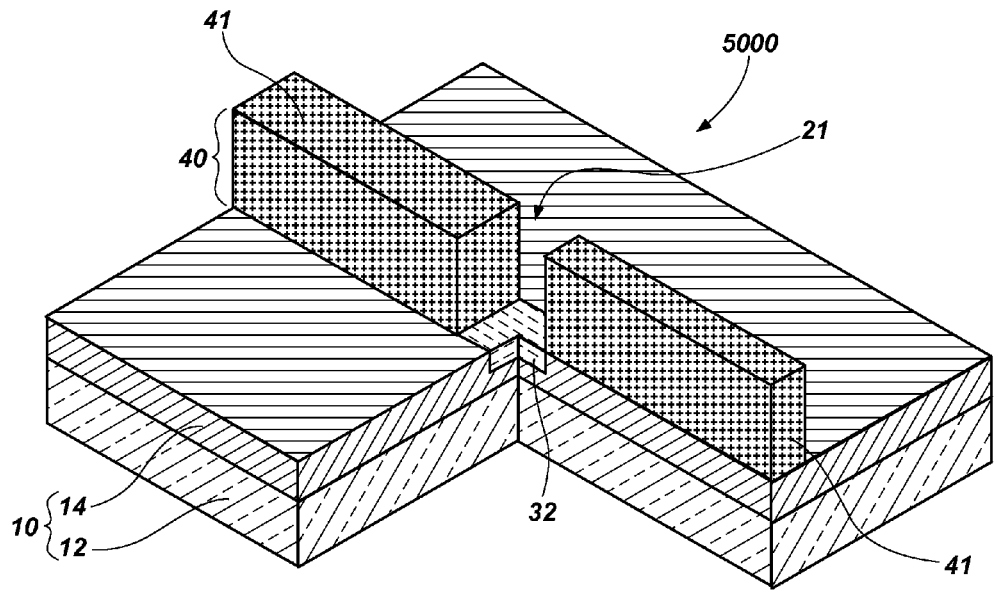

FIGS. 46 through 50 illustrate a method of forming an interrupted resist feature using an uninterrupted mask, a positive tone development, and acidic chemical proximity correction to a segment of unexposed patterning resist. The method of FIGS. 46 through 50 is similar to that described above with regard to FIGS. 3 through 8B with the exception that the marker material 30 is formulated as an acidic marker material 32. As such, with reference to FIG. 48, acid from the acidic marker material 32 may be transferred to a lower surface of a segment of the patterning material, i.e., a proximate segment of unexposed, basic patterning resist 41, to encourage development and removal by the positive tone developer. Such an acidic marker material 32 may be formulated to include large amounts of acid so as to accommodate substantial transfer of acid from the acidic marker material 32 to the proximate segment of basic patterning resist 41 to accomplish an effective conversion of the proximate segment from basic patterning resist 41 to acidic patterning resist 42, as illustrated in FIG. 49. Therefore, the acidic chemical proximity correction allows for formation of an interrupted resist feature 5000, as illustrated in FIG. 50, though an uninterrupted mask, e.g., mask 50 (FIG. 47) was used to selectively expose the patterning resist 40.

In some embodiments, use of a conventional masking process or conventional exposure process may result in exposure of a segment of the patterning resist meant to remain unexposed. If it is known that a particular resist pattern to be formed is vulnerable at such a region, the acidic chemical proximity correction described above may be used to effectively convert an unexposed segment of patterning resist, i.e., a segment of basic patterning resist 41, into an effectively exposed segment of patterning resist, i.e., a segment of acidic patterning resist 42. Thereafter, in development, the converted segment may be developed, or not developed, depending on the developer used, along with other segments of acidic patterning resist 42.

Figure 51:
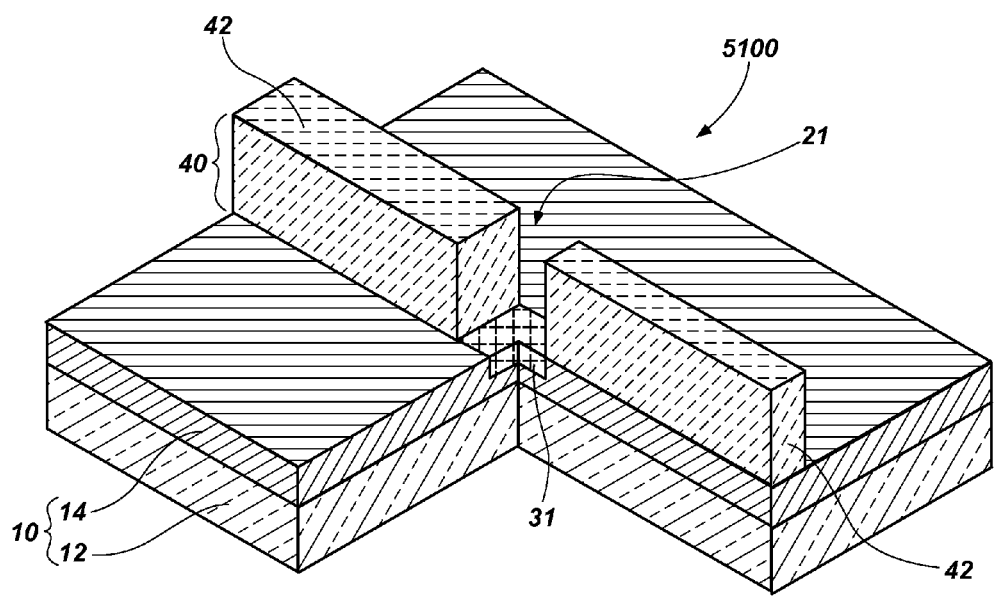
FIG. 51 is an isometric cut-away schematic illustration of an interrupted resist feature formed according to an embodiment of the present disclosure using an uninterrupted mask, a negative tone development, and basic chemical proximity correction to a segment of unexposed patterning resist.

FIG. 51 illustrates an interrupted resist feature formed using an uninterrupted mask, a negative tone development, and basic chemical proximity correction to a segment of unexposed resist. The method used to form an interrupted resist feature 5100, illustrated in FIG. 51, may be similar to that described above with regard to FIGS. 9 through 14B, except that the marker material 30 is formulated as a basic marker material 31. As such, base from the basic marker material 31 may be transferred to a proximate segment of patterning resist 40, i.e., a proximate segment of exposed, acidic patterning resist 42, to encourage development and removal by a negative tone developer. Such a basic marker material 31 may be formulated to include large amounts of base so as to accommodate substantial transfer of base from the basic marker material 31 to the proximate segment of acidic patterning resist 42 to accomplish an effective conversion of the acidic patterning resist 42 into basic patterning resist 41. Thereafter, the base-converted segment of basic patterning resist 41 may be developed along with the other segments of basic patterning resist 41, forming the interrupted resist feature 5100, despite using an uninterrupted mask, e.g., mask 50 (FIG. 12B).

In some embodiments, use of a conventional masking process or conventional exposure process may result in exposure of a segment of the patterning resist that was meant to remain unexposed. If it is known that a particular resist pattern to be formed is vulnerable at such a region, the basic chemical proximity correction described above may be used to effectively convert an exposed segment of patterning resist, e.g., a segment of acidic patterning resist 42, into an effectively unexposed segment of patterning resist, i.e., a segment of basic patterning resist 41. Thereafter, in development, the converted segment may be developed, or not developed, depending on the developer used, along with other segments of basic patterning resist 41.

Figure 52:
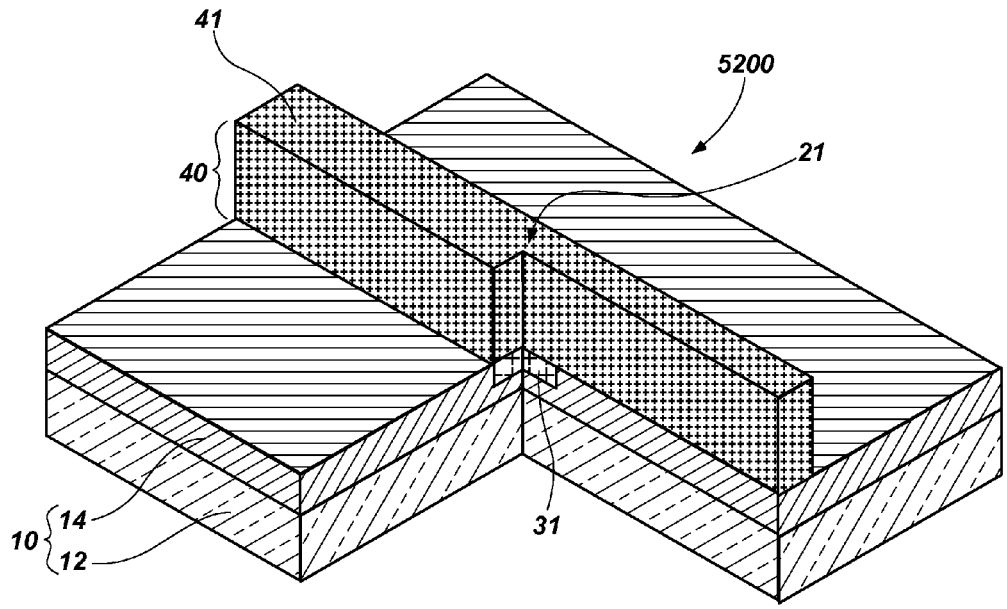
FIG. 52 is an isometric cut-away schematic illustration of an uninterrupted resist feature formed according to an embodiment of the present disclosure using an interrupted mask, a positive tone development, and basic chemical proximity correction to a segment of exposed patterning resist.

FIG. 52 illustrates an uninterrupted resist feature formed using an interrupted mask, a positive tone development, and basic chemical proximity correction to a segment of exposed resist. The method used to form an uninterrupted resist feature 5200, illustrated in FIG. 52, may be similar to that described above with regard to FIGS. 15 through 20B, except that the marker material 30 is formulated as basic marker material 31. The basic marker material 31 diffuses base into a proximate segment of acidic patterning resist 42 (see FIG. 19B), e.g., a segment of unintentionally-exposed patterning resist 40, to effectively convert the proximate segment to basic patterning resist 41, i.e., effectively unexposed patterning resist 40. Thus, the basic marker material 31 discourages development of the proximate segment in a subsequent positive tone development process, resulting in the uninterrupted resist feature 5200, despite the initial formation of interrupted regions of basic patterning resist 41.

Figure 53:
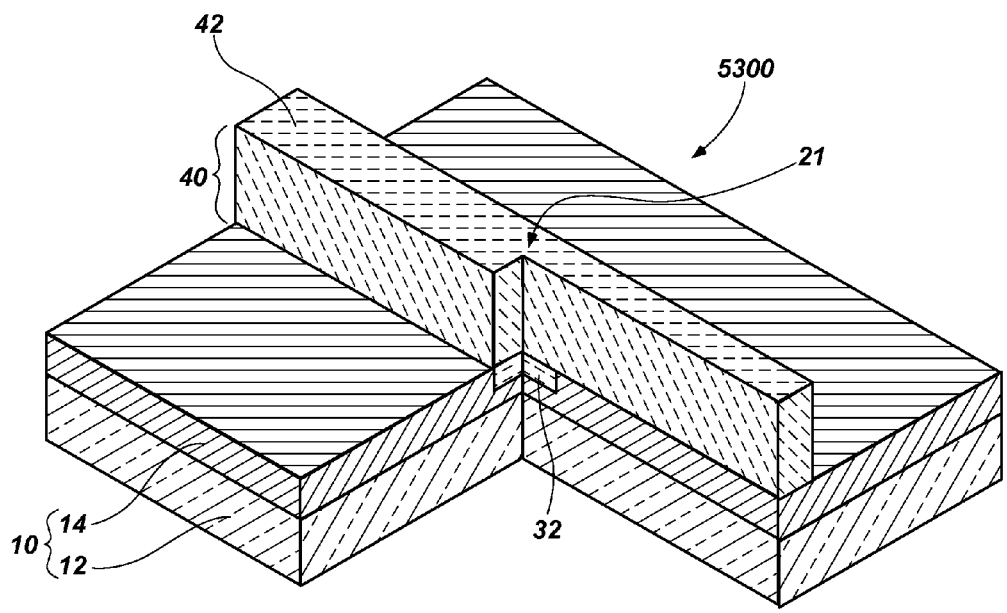
FIG. 53 is an isometric cut-away schematic illustration of an uninterrupted resist feature formed according to an embodiment of the present disclosure using an interrupted mask, a negative tone development, and acidic chemical proximity correction to a segment of exposed patterning resist.

FIG. 53 illustrates an uninterrupted resist feature formed using an interrupted mask, a negative tone development, and acidic chemical proximity correction to a segment of exposed resist. The method used to form an uninterrupted resist feature 5300, illustrated in FIG. 53, may be similar to that described above with regard to FIGS. 21 through 26B, except that the marker material 30 is formulated as acidic marker material 32. The acidic marker material 32 transfers acid to a proximate segment of basic patterning resist 41 (see FIG. 25B), e.g., a segment of unintentionally unexposed patterning resist 40, to effectively convert the proximate segment to acidic patterning resist 42, i.e., effectively exposed patterning resist 40. Thus, the acidic marker material 32 discourages development of the proximate segment in a subsequent negative tone development process, resulting in the uninterrupted resist features 5300, despite the initial formation of interrupted regions of acidic patterning resist 42.

In other embodiments, a combination of acidic chemical proximity correction and base chemical proximity correction techniques may be utilized simultaneously. In still other embodiments, acidic chemical proximity correction, basic chemical proximity correction, or both may be used to discourage development of one segment of patterning resist 40 while simultaneously encouraging development of another segment of patterning resist 40.

Accordingly, disclosed is a method of forming a pattern in a resist, the method comprising forming a resist on a base material and selectively exposing an upper surface of the resist to define an acidic resist region and a non-acidic resist region. Acid is added to a lower surface of a segment of the non-acidic resist region to convert the segment of the non-acidic resist region into an acidic resist segment, leaving another segment of the non-acidic resist region. The resist is developed with a developer selective for one of the acidic resist segment and the another segment of the non-acidic resist region over another of the acidic resist segment and the another segment of the non-acidic resist region.

Also disclosed is a method of forming a pattern in a resist, the method comprising forming a resist on a base material and selectively exposing an upper surface of the resist to define an acidic resist region and a non-acidic resist region. Base is added to a lower surface of a segment of the acidic resist region to convert the segment of the acidic resist region into a non-acidic resist segment, leaving another segment of the acidic resist region. The resist is developed with a developer selective for one of the non-acidic resist segment and the another segment of the acidic resist region over another of the non-acidic resist segment and the another segment of the acidic resist region.

The foregoing methods may be useful to pattern a resist material in an intricate pattern that would otherwise be vulnerable to line breaks, line merges, or misalignments if implemented according to conventional processes.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A method of forming a resist feature, the method comprising:
    forming a recess or a trench in a base material;
    filling the recess or the trench with a marker material comprising a compound formulated to be acidic or basic;
    forming a patterning resist above the marker material in the recess or the trench in the base material;
    selectively exposing the patterning resist to define at least one region of exposed resist and at least one region of unexposed resist, an acidity of the at least one region of exposed resist exceeding an acidity of the at least one region of unexposed resist; and
    diffusing the compound from the marker material into an overlying segment of the patterning resist contacting the marker material to alter an acidity of the overlying segment of the patterning resist, the overlying segment of the patterning resist comprising one or more of a segment of the at least one region of exposed resist and a segment of the at least one region of unexposed resist,
    the overlying segment of the patterning resist having, before the diffusing, a lower acidity than the marker material, wherein the marker material comprises the compound formulated to be acidic, or the overlying segment of the patterning resist having, before the diffusing, a lower basicity than the marker material, wherein the marker material comprises the compound formulated to be basic.

2. The method of claim 1, wherein:
    filling the recess or the trench with a marker material comprises filling the recess or the trench with the marker material comprising the compound formulated to be an acidic marker material; and
    diffusing the compound from the marker material into an overlying segment of the patterning resist contacting the marker material comprises diffusing acid from the acidic marker material into the overlying segment of the patterning resist contacting the acidic marker material to increase the acidity of the overlying segment of the patterning resist, the overlying segment of the patterning resist comprising one or more of the segment of the at least one region of exposed resist and the segment of the at least one region of unexposed resist.

3. The method of claim 2, wherein diffusing acid from the acidic marker material into the overlying segment of the patterning resist contacting the acidic marker material comprises diffusing acid from the acidic marker material into the overlying segment of the patterning resist, the overlying segment of the patterning resist comprising the segment of the at least one region of exposed resist to increase the acidity of the segment of the at least one region of exposed resist.

4. The method of claim 3, further comprising developing the patterning resist with a positive tone developer to remove at least the segment of the at least one region of exposed resist.

5. The method of claim 3, further comprising developing the patterning resist with a negative tone developer to remove the at least one region of unexposed resist without removing the segment of the at least one region of exposed resist.

6. The method of claim 2, wherein diffusing acid from the acidic marker material into the overlying segment of the patterning resist contacting the acidic marker material comprises diffusing acid from the acidic marker material into the overlying segment of the patterning resist, the overlying segment of the patterning resist comprising the segment of the at least one region of unexposed resist to increase the acidity of the segment of the at least one region of unexposed resist.

7. The method of claim 6, further comprising developing the patterning resist with a positive tone developer to remove at least the segment of the at least one region of unexposed resist.

8. The method of claim 6, further comprising developing the patterning resist with a negative tone developer to remove a portion of the at least one region of unexposed resist without removing all the segment of the at least one region of unexposed resist.

9. The method of claim 1, wherein:
    filling the recess or the trench with a marker material comprises filling the recess or the trench with the marker material comprising the compound formulated to be a basic marker material; and
    diffusing the compound from the marker material into an overlying segment of the patterning resist contacting the marker material comprises diffusing base from the basic marker material into the overlying segment of the patterning resist contacting the basic marker material to decrease the acidity of the overlying segment of the patterning resist, the overlying segment of the patterning resist comprising one or more of the segment of the at least one region of exposed resist and the segment of the at least one region of unexposed resist.

10. The method of claim 9, wherein diffusing base from the basic marker material into the overlying segment of the patterning resist contacting the basic marker material comprises diffusing base from the basic marker material into the overlying segment of the patterning resist, the overlying segment of the patterning resist comprising the segment of the at least one region of unexposed resist to decrease the acidity of the segment of the at least one region of unexposed resist.

11. The method of claim 10, further comprising developing the patterning resist with a positive tone developer to remove the at least one region of exposed resist without removing the segment of the at least one region of unexposed resist.

12. The method of claim 10, further comprising developing the patterning resist with a negative tone developer to remove at least the segment of the at least one region of unexposed resist.

13. The method of claim 9, wherein diffusing base from the basic marker material into the overlying segment of the patterning resist contacting the basic marker material comprises diffusing base from the basic marker material into the overlying segment of the patterning resist, the overlying segment of the patterning resist comprising the segment of the at least one region of exposed resist to decrease the acidity of the segment of the at least one region of exposed resist.

14. The method of claim 13, further comprising developing the patterning resist with a positive tone developer to remove the at least one region of unexposed resist without removing the segment of the at least one region of exposed resist.

15. The method of claim 13, further comprising developing the patterning resist with a negative tone developer to remove at least the segment of the at least one region of exposed resist.

16. A method of forming a resist feature, the method comprising:
   forming a discrete feature of a marker material supported by a base material, the marker material comprising acid or base;
   forming a patterning resist over the base material and over and in contact with the marker material, a segment of the patterning resist in contact with the marker material having a lower acidity than the marker material, wherein the marker material comprises the acid or having a lower basicity than the marker material, wherein the marker material comprises the base; and
   transferring the acid or the base from the discrete feature of the marker material to a lower area of the segment of the patterning resist to alter developability of the patterning resist in at least the segment of the patterning resist proximate to the lower area.

17. The method of claim 16, further comprising:
   prior to transferring the acid or the base from the discrete feature of the marker material to the lower area of the segment of the patterning resist, selectively exposing the patterning resist to define at least one region of exposed resist and at least one region of unexposed resist; and
   wherein transferring the acid or the base from the discrete feature of the marker material to the lower area of the segment of the patterning resist comprises:
      prior to forming the patterning resist, exposing the marker material to energy to generate the acid or the base; and
      after forming the patterning resist, diffusing the acid or the base from the discrete feature of the marker material to the lower area of the segment of the patterning resist to alter the developability of the patterning resist in at least the segment of the patterning resist proximate to the lower area.

18. The method of claim 16:
   wherein forming a discrete feature of a marker material supported by a base material comprises forming the discrete feature of the marker material supported by the base material, the marker material comprising the acid;
   further comprising selectively exposing an upper surface of the patterning resist to define an acidic resist region and a non-acidic resist region;
   wherein transferring the acid or the base from the discrete feature of the marker material to a lower area of the segment of the patterning resist comprises transferring the acid from the discrete feature of the marker material to a lower surface of a segment of the non-acidic resist region to convert the segment of the non-acidic resist region into an acidic resist segment, leaving another segment of the non-acidic resist region; and
   further comprising developing the patterning resist with a developer selective for one of the acidic resist segment and the another segment of the non-acidic resist region over another of the acidic resist segment and the another segment of the non-acidic resist region.

19. The method of claim 18, wherein forming the discrete feature of the marker material supported by the base material comprises:
   forming a recess in the base material; and
   forming the marker material in the recess, the marker material comprising a photo-acidic generator formulated to generate the acid upon photo-exposing the marker material.

20. The method of claim 18, wherein forming the discrete feature of the marker material supported by the base material comprises:
   forming a recess in the base material; and
   forming the marker material in the recess, the marker material comprising a thermal acidic generator formulated to generate the acid upon heating the marker material.

21. The method of claim 16:
   wherein forming a discrete feature of a marker material supported by a base material comprises forming the discrete feature of the marker material supported by the base material, the marker material comprising the base;
   further comprising selectively exposing an upper surface of the patterning resist to define an acidic resist region and a non-acidic resist region;
   wherein transferring the acid or the base from the discrete feature of the marker material to a lower area of the segment of the patterning resist comprises transferring the base from the discrete feature of the marker material to a lower surface of a segment of the acidic resist region to convert the segment of the acidic resist region into a non-acidic resist segment, leaving another segment of the acidic resist region; and
   further comprising developing the patterning resist with a developer selective for one of the non-acidic resist segment and the another segment of the acidic resist region over another of the non-acidic resist segment and the another segment of the acidic resist region.

22. The method of claim 21, wherein forming the discrete feature of the marker material supported by the base material comprises:
   forming a recess in the base material; and
   forming the marker material in the recess, the marker material comprising a thermal base generator formulated to generate the base upon heating the marker material.

23. The method of claim 16:
   further comprising selectively exposing the patterning resist to form at least one soluble region of the patterning resist, the at least one soluble region of the patterning resist being soluble in a developer;

wherein transferring the acid or the base from the discrete feature of the marker material to a lower area of the segment of the patterning resist comprises, without exposing the patterning resist again, transferring the acid or the base to the lower area of at least the segment of the patterning resist to alter solubility of at least the segment of the patterning resist in the developer; and further comprising exposing the patterning resist to the developer.

24. A method of forming an array of aligned elongate resist features, the method comprising:
    forming a discrete feature of a marker material supported by a base material, the marker material comprising at least one of an acid or a base;
    forming a patterning resist over the base material;
    transferring the at least one of the acid or the base from the marker material to a region of the patterning resist contacting the discrete feature of the marker material to increase or decrease developability of the region of the patterning resist relative to another region of the patterning resist, the region of the patterning resist having, prior to the transferring, a lower acidity than the marker material, wherein the marker material comprises the acid, or having, prior to the transferring, a lower basicity than the marker material, wherein the marker material comprises the acid; and
    selectively exposing and developing the patterning resist to define an array of elongate resist features, a plurality of the elongate resist features of the array terminating in substantial alignment proximate to the discrete feature of the marker material.

25. The method of claim 24, wherein forming a patterning resist over the base material comprises applying over the base material and the marker material a patterning resist dissolved in a solvent in which the marker material is insoluble.

* * * * *

UNITED STATES PATENT AND TRADEMARK OFFICE
CERTIFICATE OF CORRECTION

PATENT NO. : 9,291,907 B2
APPLICATION NO. : 13/475574
DATED : March 22, 2016
INVENTOR(S) : Kaveri Jain et al.

Page 1 of 1

It is certified that error appears in the above-identified patent and that said Letters Patent is hereby corrected as shown below:

In the claims:
CLAIM 16, COLUMN 21, LINE 39, change "the acid or having" to --the acid, or having--

Signed and Sealed this
Fourteenth Day of June, 2016

Michelle K. Lee
*Director of the United States Patent and Trademark Office*